(12) United States Patent
Kojima

(10) Patent No.: US 7,884,474 B2
(45) Date of Patent: Feb. 8, 2011

(54) METHOD FOR FABRICATING SEMICONDUCTOR DEVICE AND SEMICONDUCTOR DEVICE

(75) Inventor: Akihiro Kojima, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 65 days.

(21) Appl. No.: 12/232,453

(22) Filed: Sep. 17, 2008

(65) Prior Publication Data
US 2009/0065946 A1 Mar. 12, 2009

Related U.S. Application Data

(62) Division of application No. 11/346,310, filed on Feb. 3, 2006, now Pat. No. 7,439,185.

(30) Foreign Application Priority Data

Mar. 22, 2005 (JP) ............... 2005-082325

(51) Int. Cl.
*H01L 23/48* (2006.01)
*H01L 23/52* (2006.01)
*H01L 29/40* (2006.01)
(52) U.S. Cl. ..................... 257/750; 257/758
(58) Field of Classification Search ........... 257/750, 257/751, 758
See application file for complete search history.

(56) References Cited

U.S. PATENT DOCUMENTS

| | | |
|---|---|---|
| 6,204,165 B1 | 3/2001 | Ghoshal |
| 6,214,719 B1 | 4/2001 | Nag |
| 6,307,265 B1 | 10/2001 | Anand et al. |
| 6,329,279 B1 | 12/2001 | Lee |
| 6,498,112 B1 | 12/2002 | Martin et al. |
| 6,524,948 B2 | 2/2003 | Tamaoka et al. |
| 6,756,321 B2 | 6/2004 | Ko et al. |
| 6,762,120 B2 | 7/2004 | Nakagawa et al. |

(Continued)

FOREIGN PATENT DOCUMENTS

JP 9-237831 9/1997

(Continued)

OTHER PUBLICATIONS

Office Action issued by the Taiwanese Patent Office on Nov. 20, 2008, for Taiwanese Patent Application No. 095107027, and partial English-language translation thereof.

(Continued)

*Primary Examiner*—S. V Clark
(74) *Attorney, Agent, or Firm*—Finnegan, Henderson, Farabow, Garrett & Dunner, L.L.P.

(57) ABSTRACT

A method of fabricating a semiconductor device having an air-gapped multilayer interconnect wiring structure is disclosed. After having formed a first thin film on or above a substrate, define a first opening in the first thin film. Then, deposit a conductive material in the first opening. Then form a second thin film made of a porous material above the first thin film with the conductive material being deposited in the first opening. Next, define in the second thin film a second opening extending therethrough, followed by deposition of a conductive material in the second opening. The first thin film is removed through voids in the second thin film after having deposited the conductive material in the second opening. An integrated semiconductor device as manufactured thereby is also disclosed.

12 Claims, 18 Drawing Sheets

U.S. PATENT DOCUMENTS

| | | | |
|---|---|---|---|
| 6,764,810 B2 | 7/2004 | Ma et al. | |
| 6,780,753 B2 | 8/2004 | Latchford et al. | |
| 6,790,770 B2 | 9/2004 | Chen et al. | |
| 6,815,329 B2 * | 11/2004 | Babich et al. | 438/619 |
| 6,861,332 B2 | 3/2005 | Park et al. | |
| 7,396,757 B2 * | 7/2008 | Yang | 438/619 |
| 2002/0098673 A1 * | 7/2002 | Yeh et al. | 438/618 |
| 2004/0087133 A1 | 5/2004 | Kumar | |
| 2009/0302475 A1 * | 12/2009 | Korogi et al. | 257/761 |
| 2010/0001409 A1 * | 1/2010 | Humbert et al. | 257/774 |

FOREIGN PATENT DOCUMENTS

| | | |
|---|---|---|
| JP | 10-294316 | 11/1998 |
| JP | 10-335592 | 12/1998 |
| JP | 2003-60032 | 2/2003 |
| JP | 2003-163264 | 6/2003 |
| JP | 2004-153280 | 5/2004 |
| JP | 2004-266244 | 9/2004 |
| TW | 368722 | 9/1999 |
| TW | 432544 | 5/2001 |
| TW | 439147 | 6/2001 |
| TW | 439182 | 6/2001 |
| TW | 2004-26947 | 12/2004 |
| WO | WO 2004-105122 A1 | 12/2004 |

OTHER PUBLICATIONS

Notification of Reasons for Refusal issued by the Japanese Patent Office on Oct. 20, 2009, for Japanese Patent Application No. 2005-082325, and English-language translation thereof.

Notification of Reason(s) for Refusal issued by the Japanese Patent Office on Jun. 15, 2010, for Japanese Patent Application No. 2005-082325, and English-language translation thereof.

* cited by examiner

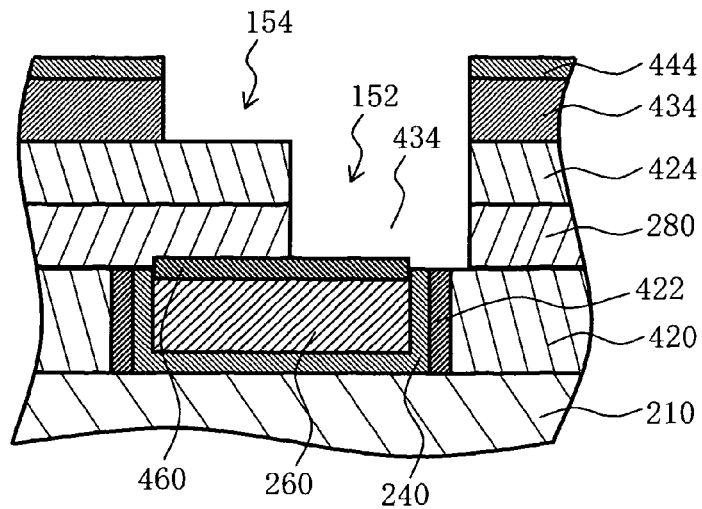
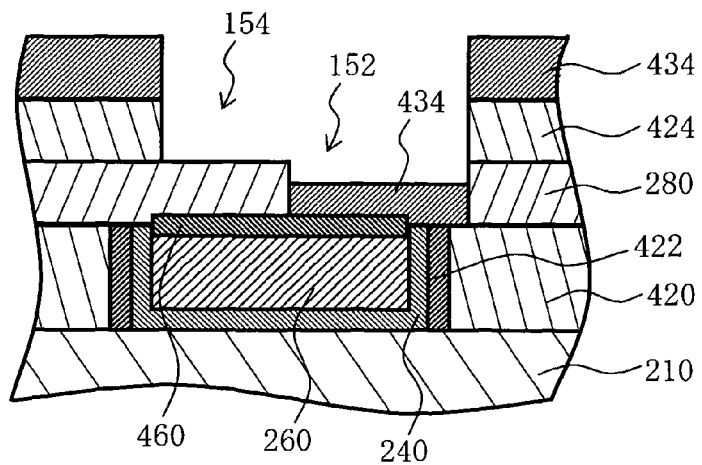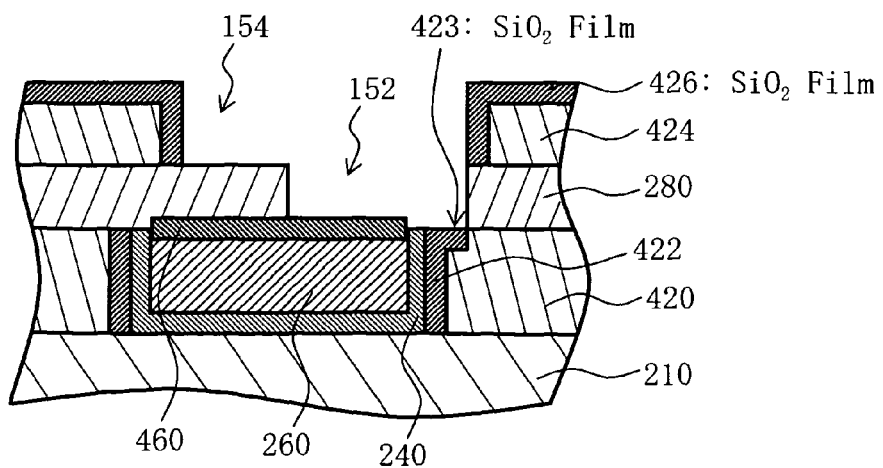

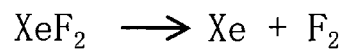

METHOD FOR FABRICATING SEMICONDUCTOR DEVICE AND SEMICONDUCTOR DEVICE

This is a divisional of application Ser. No. 11/346,310, filed Feb. 3, 2006 now U.S. Pat. No. 7,439,185, which is incorporated herein by reference.

CROSS-REFERENCE TO RELATED APPLICATION

This application is based upon and claims the benefit of priority from prior Japanese Patent Application No. 2005-082325, filed on Mar. 22, 2005, the entire contents of which are incorporated herein by reference.

BACKGROUND OF THE INVENTION

1. Field of the Invention

The present invention relates generally to semiconductor device technologies and, more particularly, to a semiconductor integrated circuit device having an interwire insulation structure formed by a damascene process during formation of multilayered wiring leads. This invention also relates to a method of making the semiconductor device.

2. Description of Related Art

In recent years, the quest for higher integration and performance in large-scale integrated (LSI) semiconductor circuit chips results in development of new microfabrication techniques. In particular, in order to achieve further enhanced performances of LSI chips, challenges are made to replace traditional conductive material, i.e., aluminum (Al), of electrical interconnect lead wires (i.e., conductors) by low-resistance metallic material, such as copper or copper alloys (collectively referred to as "Cu" hereinafter). Cu has the difficulty of micropatterning by currently-established dry etch techniques, which are widely used to form Al-alloy on-chip wires. An approach to breaking through this difficulty is to employ what is called the damascene process, which includes the steps of depositing a Cu film on or above an insulative or dielectric film with grooves defined therein, and then removing selected portions of the Cu film other than those buried in the grooves by chemical-mechanical polish (CMP) techniques to thereby form a pattern of buried interconnect wires. The Cu film is typically formed by a process which includes forming a thin seed layer by sputter techniques and thereafter applying thereto electrolytic plating to thereby provide a stacked film having its thickness of about several hundreds of nanometer (nm). In the case of forming a multilayer Cu wiring pattern, the so-called dual-damascene process is employable. This process includes depositing a dielectric film on or above a lower-level wiring layer, defining therein through-going holes, known as "via holes," and trench-like wiring grooves used for upper-level wiring leads, forming a layer of Cu wiring material to fill both the via holes and the trenches at a time, and performing planarization for removing an unnecessary surface portion of the Cu layer, thereby to form buried or "inlayed" interconnect wires.

Recently, it is under consideration to use an insulative material that is low in dielectric constant, k, for interlayer dielectric (ILD) films. More specifically, attempts are made to reduce the parasitic capacitance between adjacent wires by use of a "low-k" film having its relative dielectric constant k on the order of approximately 3.5 or below, which is less than that (4.2) of silicon oxides ($SiO_2$). One low-k material already in use is fluorosilicate glass (FSG); however, this material has its limit in dielectric constant reduction from a viewpoint of film quality stabilities. The reducibility of relative dielectric constant k stays merely at about 4.2 to 3.3 of the prior art. While low-k film materials with relative dielectric constant k of 2.5 or less are also under development, most of them ace porous materials with bubble-like holes or voids contained therein. These porous low-k (p-lowk) films are fabricated by coating or chemical vapor deposition (CVD) processes; however, resultant p-lowk films are lower in density than thermally oxidized silicon films. Additionally, those materials of relative dielectric constant k of 2.0 or below are less in applicability in view of their deficiency in etchability and mechanical strength properties.

Consequently, in order to further lower the dielectric constant of ILD films to an extent lower than that of the above-noted p-lowk film, an attempt is made to develop a technique for cavitating interwire portions—i.e., forming cavities between neighboring onchip wires. Such cavities are called the "air gaps" in the semiconductor device art. An exemplary method is disclosed in Published Unexamined Japanese Patent Application No. 9-237831 (JP-A-9-237831). This method as taught thereby includes the steps of forming a carbon (C) layer, defining therein wiring grooves, depositing Cu to fill these wire grooves, forming a silicon oxide film to "cap" an entire top surface of resultant structure, forming a pattern of underlayer wires, and applying ashing to the C layer for cavitation. After having formed the cavities, a multilayer wiring structure is formed.

Other air-gap forming techniques include a process for defining air gaps in a dielectric film at its selected portions spaced far from via plugs (for example, see JP-A-2004-153280), and a process of forming air gaps in a single wiring layer at portions in dielectric film regions thereof in such a manner that these air gaps are surrounded by a silicon nitride film (see JP-A-2003-60032).

Unfortunately, the prior known processes are encountered with a problem which follows. In cases where a multilayer wiring structure is formed after having formed the air gaps between the underlayer wires as in the prior art, when defining via holes corresponding thereto in a dielectric film formed to overlie the underlayer wires, the via holes can deviate in position from their corresponding underlayer wires, causing misalignment therebetween. Once such misalignment occurs, the via holes behave to penetrate and burst through an ILD film, resulting in unwanted pass-through toward the underlying air gaps between wires. This "via-hole penetration" problem leads to creation of abnormal pattern shapes, which in turn makes it impossible to form any intended wires: as a matter of course, the parasitic capacitance reduction is by no means achievable. In other words, with the above-noted techniques for forming a multilayer wiring structure after formation of air gaps between underlayer wires, any misalignment with underlayer wires is hardly tolerable, which spoils the effective utilizability of air gap structures. Especially, in case via holes and trenches are defined with increased precision in a dielectric film overlying the underlayer wires, the difficulty becomes more serious because the etching depth required becomes larger than that in the case of forming the via holes only.

Even when considering a single wiring layer, the technique for forming silicon nitride film-surrounded air gaps in a wiring layer at portions of its dielectric film regions is faced with difficulties in reducing the parasitic capacitance sufficiently. One reason of this is that those regions in which the air gaps are to be formed are mere portions of the dielectric film region of the wiring layer. Another reason is that the air gaps formed are surrounded by the silicon nitride film, which is high in dielectric constant.

BRIEF SUMMARY OF THE INVENTION

In accordance with one aspect of this invention, a method for fabricating a semiconductor device comprises:

forming a first thin film above a substrate;

defining a first opening in said first thin film;

depositing a conductive material in the first opening;

forming a second thin film made of a porous material above said first thin film with said conductive material being deposited in the first opening;

defining in said second thin film a second opening extending therethrough;

depositing a conductive material in the second opening; and removing said first thin film through voids in said second thin film after deposition of said conductive material in the second opening.

In accordance with another aspect of the invention, a method of fabricating a semiconductor device comprises:

forming above a substrate a first wiring layer with a plurality of electrical wires being buried in a sacrifice film;

forming above said first wiring layer a second wiring layer having via plugs for connection to said wires; and removing of said sacrifice film between adjacent wires of said first wiring layer to thereby form a cavity after having formed said second wiring layer.

In accordance with a further aspect of the invention, a semiconductor device comprises:

a plurality of wires having a cavity defined between neighboring ones of said wires; and a reinforcing film being disposed on a sidewall of each said wire and having a flange projecting toward said cavity 3 at least one portion thereof.

BRIEF DESCRIPTION OF THE FIGURES OF THE DRAWING

FIGS. 3A through 10C depict in cross-section other steps during fabrication of the semiconductor device as executed in accordance with the flowchart of FIG. 1.

DETAILED DESCRIPTION OF THE INVENTION

Currently forms of a semiconductor device incorporating the embodiments principles of the invention which effectively employs the "air gap" structure and is free from the problems faced with the prior art, will be described along with fabrication methodology thereof.

Embodiment 1

In the case of a dual-damascene structure having air gaps in a lower-level electrical interconnect wiring layer for reduction of the parasitic capacitance, one desirable approach to reducing the parasitic capacitance of an upper-level layer is to form on or above the underlayer wires an electrically insulative or dielectric film made of a chosen material of low dielectric constant k and then define via holes in this "low-k" film. Unfortunately, this approach accompanies a penalty: it is difficult to define ultra-fine via holes in the low-k film material with high accuracy. The prior art techniques as set forth in the introductory part of the description are designed to perform air-gap formation in units of wiring layers and, for this reason, are encountered with problems, such as the inability to tolerate misalignment with the underlayer wires. This is a serious bar to effective utilization of the air gap structure. Disclosed below is a semiconductor device fabrication method in accordance with an embodiment 1, which includes the steps of forming an underlayer wiring pattern by use of silicon (Si), performing oxidation processing (i.e., altering Si to $SiO_2$) to thereby modify or change in quality its sidewall portions (i.e., oxidize the same), forming a dielectric film made of porous material (having micro-holes or voids) on the underlayer wiring pattern to thereby provide a dual damascene structure (metal wires), and thereafter removing the underlying Si layer through the voids thereof. Regarding possible misalignment portions which pose problems in the prior art, any appreciable penetration or "shoot-out" no longer occurs because of the presence of the silicon and its modified or "quality-improved" layer at the time the etching is done to form interconnect holes (via holes). Forming air gaps after having formed such wiring structure permits dual damascene structures also to employ the air gap structure.

Figure 1:
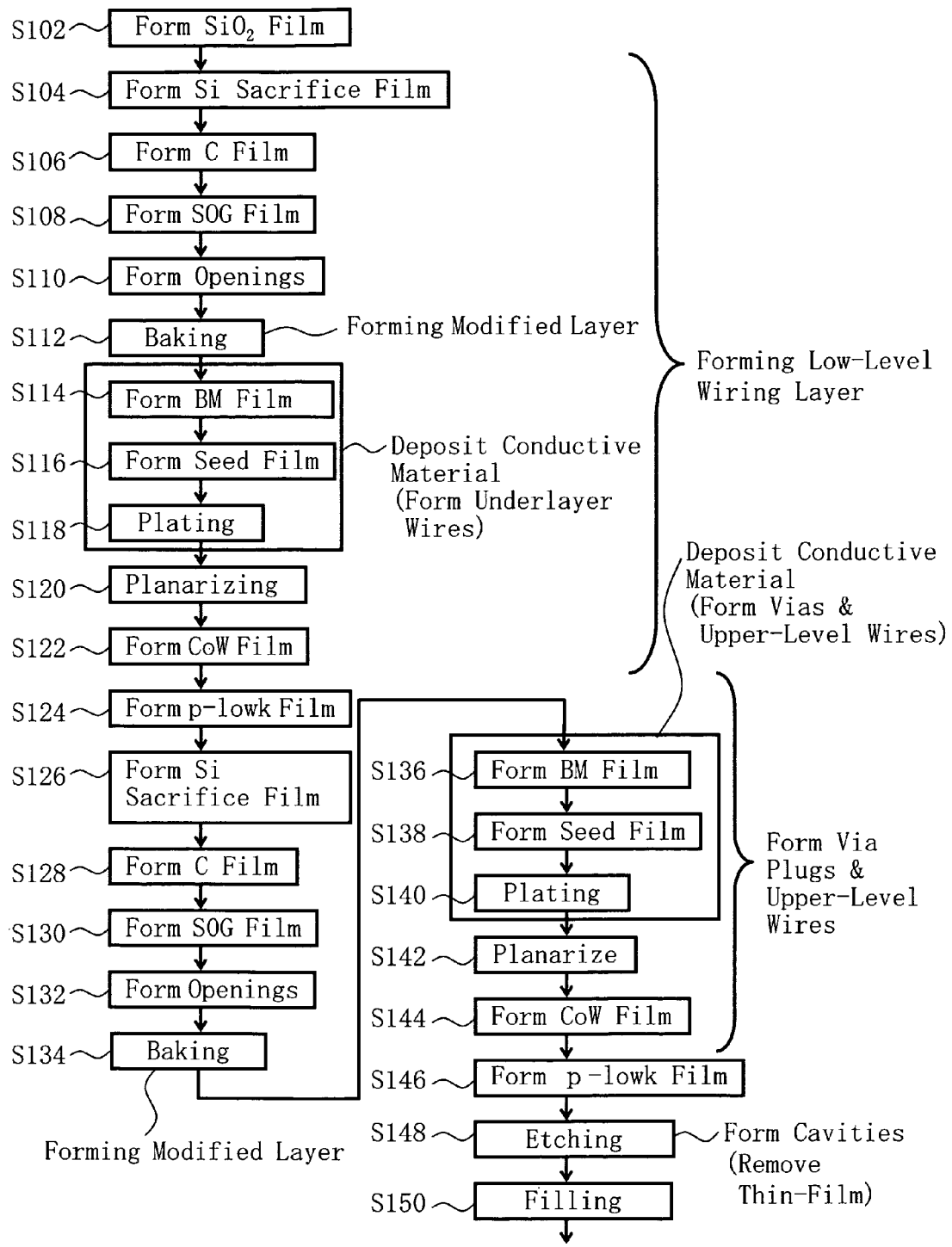
FIG. 1 is a flow chart showing some major process steps in the manufacture of a semiconductor device in accordance with an embodiment 1 of this invention.

Referring now to FIG. 1, a process flow is shown of the semiconductor device fabrication method in accordance with the embodiment 1 of the invention. As shown herein, this method is arranged to perform a series of processes which follow. Firstly, at step S102, a silicon oxide ($SiO_2$) film is formed on a substrate. Then, at step S104, a lower-level wiring layer is formed. In this step, a silicon (Si) sacrifice thin-film is formed so that openings or through-going holes used for electrical interconnection with the underlayer wires are defined therein. Then at step S106, a carbon (C) film is formed. Next, at step S108, a spin-on-glass (SOG) film is formed. At step S110, define openings therein. At step S112, perform thermal processing to thereby form a modified or "quality-improved" film. At step S114, deposit a layer of conductive material—typically, a barrier metal (BM) film. At step S116, form a seed film. At step S118, perform plating and annealing. At step S120, perform planarization. At step S122, form a cobalt-tungsten (CoW) film. At step S124, form inter-level conductors, known as "via plugs," and an upper-level wiring layer. More specifically, form a thin-film of porous dielectric material having a low dielectric constant k—say, "p-lowk" film. This film is for later use as an insulator film for electrical isolation of the via plugs. Then, at step S126, form a thin-film for use as an Si sacrifice film in which openings used for upper-level lead wires are to be defined. At step S128, form a carbon (C) film. At step S130, form an SOG film. At step S132, define openings. At step S134, perform thermal processing to form a modified film. At step S136, deposit a layer of conductive material. An example of it is a barrier metal (BM) film. At step S138, form a seed film. At step S140, perform plating and annealing, followed by Step S142 which executes planarization. At step S144, form a CoW film. At step S146, form a p-lowk film made of a porous insulative material, which is for use as an upper-level dielectric film. At step S148, apply selective etching to resultant device structure for removing selected portions of the thin-film, i.e., the Si sacrifice film, thereby defining voids or cavities therein. At step S150, perform filling.

FIGS. 2A to 2D illustrate, in cross-section, intermediate product device structures at those process steps corresponding to the $SiO_2$ film formation step S102 through the SOG film formation step S108 shown in FIG. 1. The other steps subsequent thereto will be described later.

Figure 2A:
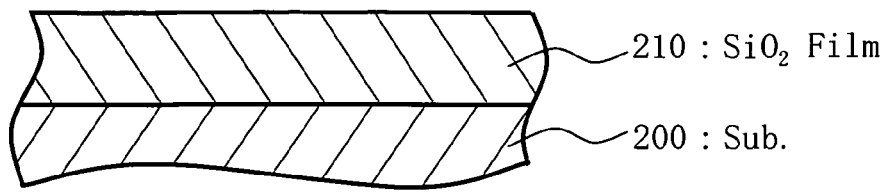
FIGS. 2A to 2D illustrate, in cross-section, some steps during fabrication of the semiconductor device in a way corresponding to the flow chart of FIG. 1.
Figure 2B:
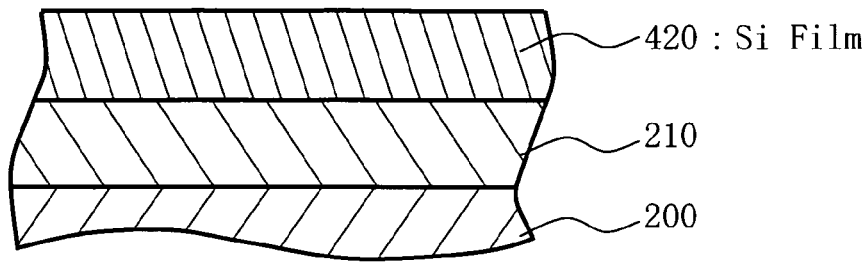

As shown in FIG. 2A, a substrative body 200 is prepared, which may be a silicon (Si) wafer having a diameter of approximately 300 millimeters (mm). Then, an $SiO_2$ film 210 is formed on the Si substrate 200 by chemical vapor deposition (CVD) or like techniques to a predetermined thickness of about 500 nanometers (nm). This film 210 is for use as an underlayer or "undercoat" film. Film 210 may be replaced with a layer with various types of semiconductor integrated circuit (IC) elements or structures and electrical conductors, such as metallic interconnect lead wires, or contact plugs (not shown) being formed therein.

Then, as shown in FIG. 28, an Si film 420 for use as an underlayer sacrifice film is formed toy sputtering or like techniques on the $SiO_2$ film 210, to a thickness of about 250 nm. The Si sacrifice film 420 will toe removed away at a later process step, causing a region in which Si film 420 was formed to become an air gap (void) as will be described later. To form the Si film 420 by sputtering, a magnetic-enhanced reactive ion etching (MERIE) apparatus of the parallel flat plate type is used. Typical process conditions are as follows: an argon (Ar) gas used is set at 0.84 Pa·m³ per second (i.e., 500 seem); an internal pressure of chamber is set at 1.33 Pa (10 mTorr); a substrate temperature is 20° C.; and, plasma discharge power is 2 kW. Under these conditions, let Ar ions collide with a top surface of Si target, thereby to dislodge Si atoms therefrom for deposition at a deposition rate of 100 ran per minute, by way of example. Preferably the Si film 420 is deposited to a thickness of about 250 to 300 nm. Using the Si film as the sacrifice film makes it possible to attain Si film removal without the use of oxygen ($O_2$) gases at a later step, which in turn enables prevention or minimization of the damageability of a later-described p-lowk film having silicon-carbon (Si—C) couplings.

Figure 2C:
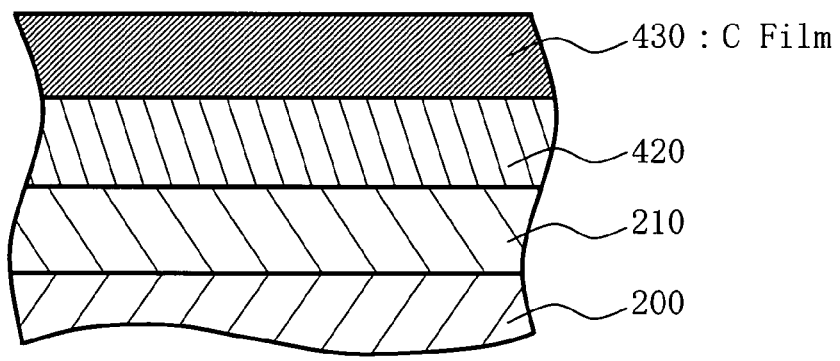

Next, as shown in FIG. 2C, a carbon (C) film 430 is formed by coating techniques on the Si sacrifice film 420. This C film 430 will be a mask for use during formation of a pattern of openings or through-going holes in Si film 420 as will be discussed later.

Figure 2D:
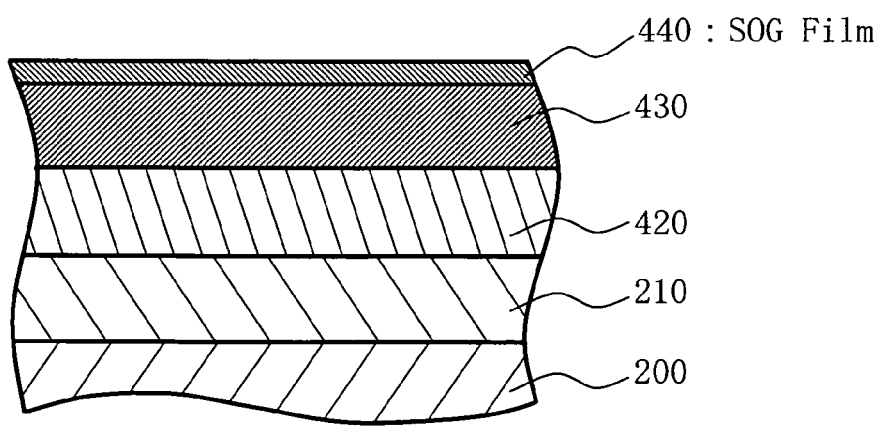

Subsequently, as shown in FIG. 2D, a film 440 is formed by spin-on-glass (SOG) techniques on the G film 430 to a thickness of about 45 nm for example. The SOG film 440 will serve as a mask used for formation of pattern openings in the C film 430 and Si sacrifice film 420. Preferably, SOG film 440 may be made of a chosen material having silicone skeletal structures. Examples of such material include, but not limited to, dimethylsiloxane and hydrogen silses-quioxane (HSQ). Preferably SOG film 440 has a thickness of about 45 nm or less, which is determined in relation to a resist film to be later described.

Figure 3A:
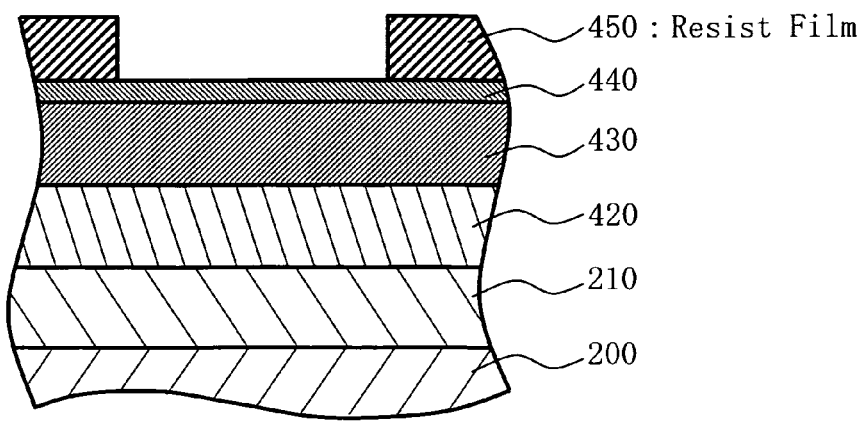
Figure 3B:
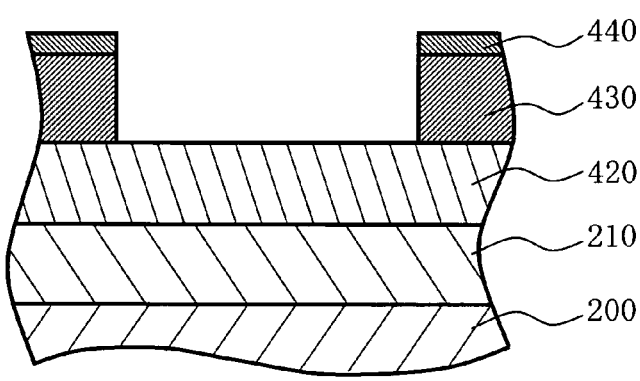
Figure 3C:
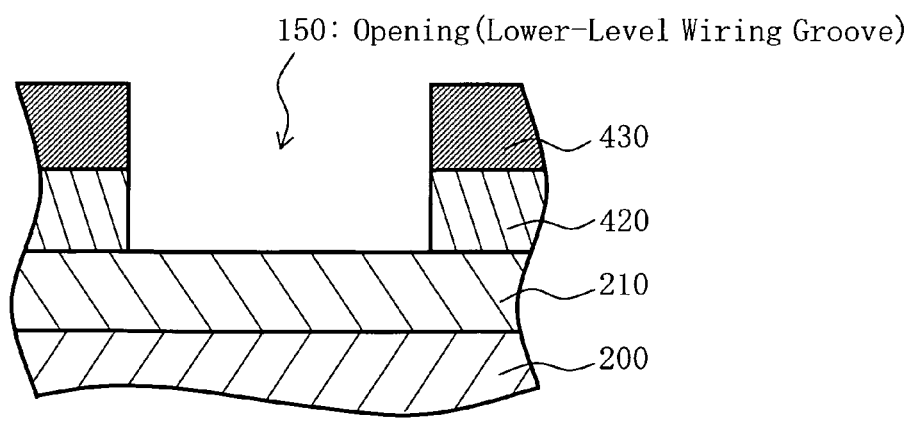

Turning to FIGS. 3A to 3C, there are shown cross-sectional device structures which are obtained in the opening defining process step S110 of FIG. 1.

As shown in FIG. 3A, a photoresist film 450 is formed on the SOG film 440. Thereafter, the resist film 450 is photolithographically patterned so that an underlayer wiring pattern is exposed and transferred thereto. Then, film 450 is developed, thus providing a resist pattern shown herein.

Then, as shown in FIG. 3B, with the patterned resist film 450 as a mask, anisotropic etching—typically, reactive ion etching (RIE)—is applied to selectively remove exposed portions of the SOG film 440 and their underlying portions of C film 430, thereby causing selected surface portions of Si sacrifice film 420 to be exposed through resultant etched openings, although only one opening is visible in FIG. 3B. During the etching, the resist film 450 is also etched away simultaneously.

Next, as shown in FIG. 3C, while using the underlayer wiring pattern-formed C film 430 as a mask, selectively etch the exposed portions of the Si film 420 by anisotropic etch techniques. An example of etcher equipment used is a dielectrically coupled RIE apparatus. Etching conditions are as follows. An etching gas supplied is a 0 mixture of borohydride (HBr) at 0.25 Pa·m³/sec (150 scan), chlorine ($Cl_2$) at 0.05 Pa·m³/sec (30 sccm) and oxygen ($O_2$) at 0.017 Pa·m³/sec (10 sccm). An in-chamber pressure is set to 0.53 Pa (4 mTorr). A substrate temperature is set at 50° C. Plasma discharge power is 500 W, and a substrate bias power is 70 W. The silicon's etching rate is set at 200 nm per minute while setting an oxide film etch rate to 10 nm/min. During etching of the Si film 420, the silicone-structured SOG film 440 overlying the C film 430 may also be etched away. Etching Si film 420 results in an opening (first opening) 150 being defined in Si film 420. The opening 150 is for later use as an underlayer wiring pattern groove. The etching of SOG film 440 may alternatively be carried out at a separate step when the need arises.

The above-stated process for defining the opening 150 in Si film 420 by use of a multilayer of C film 430 and SOG film 440 is known as a multilayer mask process. An example of such process used here is a stacked mask process (SMAP) method. While applying micropatterning to the Si film 420 with a resist being directly used as a mask would result in focal depth becoming shallower due to downscaling or miniaturization and thus raises a need to thicken the resist required, the use of SMAP process makes it possible to make the resist film 450 thinner. In this respect, using SMAP process is more preferable, although this invention does not intend to eliminate approaches to patterning Si film 420 with the resist being directly used as a mask. Another exemplary pattern transfer process is available, which is without formation of the SOG film 440; alternatively, the exposure/development-applied resist film 450 per se is made of silicone or silicone-containing materials.

Referring next to FIGS. 4A-4D, a series of processes corresponding to the thermal processing step S112 to plating/annealing step S118 of FIG. 1 will be discussed in detail below.

Figure 4A:
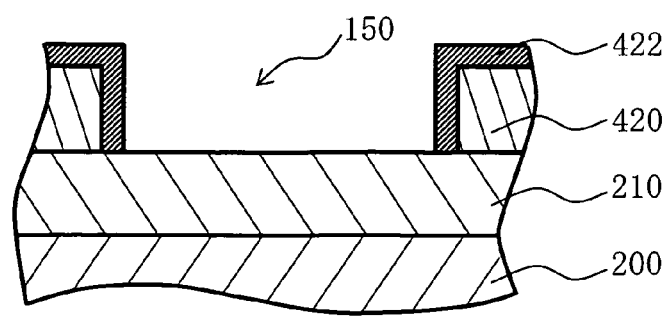

As shown in FIG. 4A, during the thermal processing which is one example of the modified layer formation process, the C mask film 430 is removed by liftoff or like techniques. Then, an oxide film 422 made for example of $SiO_2$ is formed on a top surface of the Si film 420 with a wiring pattern formed therein. Thermal processing may be done by ashing techniques. To do this, parallel flat-plate type RIE apparatus is employable. Process conditions are as follows: an oxygen ($O_2$) gas is used at 0.84 Pa·m$^3$/sec (500 sccm); the chamber-interior pressure is set at 1.33 Pa (10 mTorr); the substrate temperature is 20° C.; plasma discharge power is 2 kW; and, ashing rate is 500 nm/minute.

The surface of Si film 420 and an inner wall of the opening defined in Si film 420 are modified or "quality-improved" by the thermal processing to thereby form a thin-film portion(s) of $SiO_2$ film 422. This results in the $SiO_2$ film 422, i.e., modified film, being placed on the sidewalls of electrical interconnect lead wires as will be described later. Such modified film covering the wire sidewalls serves as a reinforcing film of these wires. Forming the reinforcing film makes it possible for the wires to increase both in the physical/mechanical strength and in the electrical characteristics, such as durabilities against electron migration (EM) and stress migration (SM). Preferably the $SiO_2$ film 422 has a thickness which is 10 percent (%) or less of a layout interval or distance of on-chip wiring leads. For example, if the wire pitch is 100 nm (i.e., wire distance is 50 nm), then let the $SiO_2$ film thickness be set to 5 nm or below. Although thicker oxide films are desirable in view of the mechanical strength and electrical reliability, the existence of an oxide film with its relative dielectric constant k of 4, or more or less, brings disadvantages as to device characteristics for achievement of low dielectricity by means of the air gaps with a relative dielectric constant of about 1. In light of this, the oxide film thickness is specifically designed so that it is about 10% or less of the wire distance, thereby enabling suppression or minimization of degradation of the device characteristics.

Figure 4B:
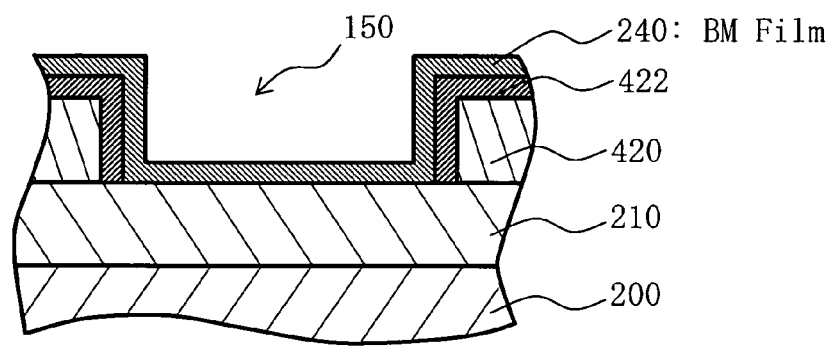

Then, as shown in FIG. 4B, a film 240 of carrier metal material is formed on the $SiO_2$ film 422 in such a manner as to cover the inner wall of the opening 150 defined in $SiO_2$ film 422. More specifically, in sputtering apparatus which is one of physical vapor deposition (PVD) tools, a tantalum (Ta) film is deposited to a thickness of about 10 nm, which film is for use as the barrier metal film 240. The presence of such Ta film improves the adhesivity of copper (Cu) wiring material. Another preferable example of the carrier metal film 240 is a stacked structure of a tantalum nitride (TaN) film with a thickness of about 5 nm and a tantalum (Ta) film of 5-nm thick as deposited thereon. With this TaN/Ta film stack structure, unwanted outdiffusion of Cu is avoidable by TaN film while at the same time improving the Cu's adhesivity by Ta film. The barrier metal material may alternatively be deposited by atomic layer deposition (ALD), atomic layer chemical vapor deposition (ALCVD) or standard CVD methods. In this case, the resultant device structure is expected to improve in film coatability when compared to PVD methods.

Figure 4C:
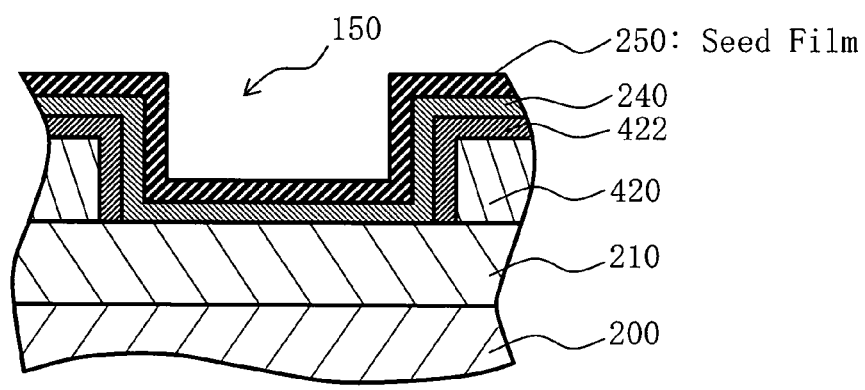

Then, as shown in FIG. 4C, a Cu thin-film 250 for use as a seed film is formed and deposited by PVD—e.g., sputtering—on an entire top surface of the barrier metal film 240 in such a way as to coat the sidewalls of opening 150 over the substrate 200. The Cu seed thin-film 250 will be used as a cathode electrode or "pole" in the next-executed electrolytic plating process. Typically seed film 250 is 75 nm thick.

Figure 4D:
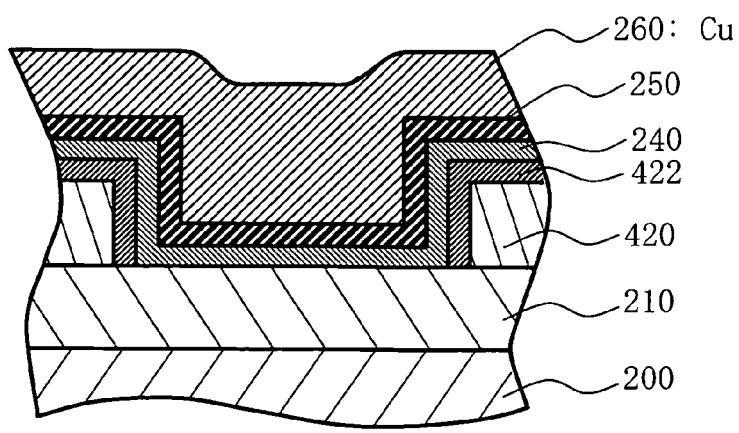

As shown in FIG. 4D, electrochemical growth such as electrolytic plating with the Cu seed film 250 as the cathode pole is carried out resulting in a Cu film 260 being deposited on the seed film 250 so that the opening 150 above the substrate 200 is filled with and buried by Cu film 260. This Cu film 260 is grown to a thickness of about 500 nm and thereafter is applied annealing at 250° C. for 30 minutes, for example. Desirably, this film thickness is set to at least twice the depth of opening 150 in order to preclude incomplete opening filling or "reclamation".

Referring next to FIGS. 5A to 5D, there are shown cross-sectional device structures obtained at the planarization step S120 to carbon film formation step S129 of FIG. 1.

Figure 5A:
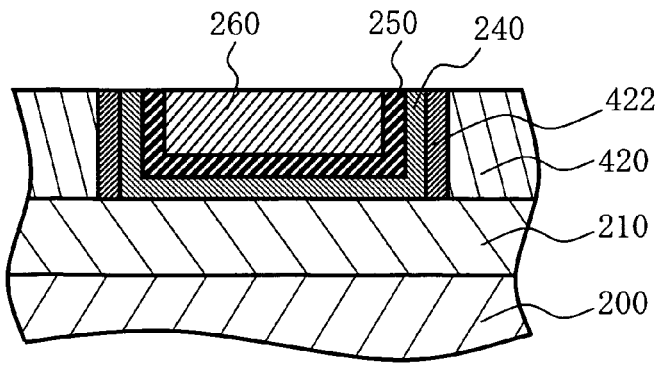

As shown in FIG. 5A, the device structure of FIG. 4D is planarized at its top surface. Preferably chemical-mechanical polish (CMP) techniques are used to remove the Cu film 260 for use as electrical wiring layer, Cu seed film 250, barrier metal film 240 and modified $SiO_2$ film 422, thus forming a buried structure shown herein.

Figure 5B:
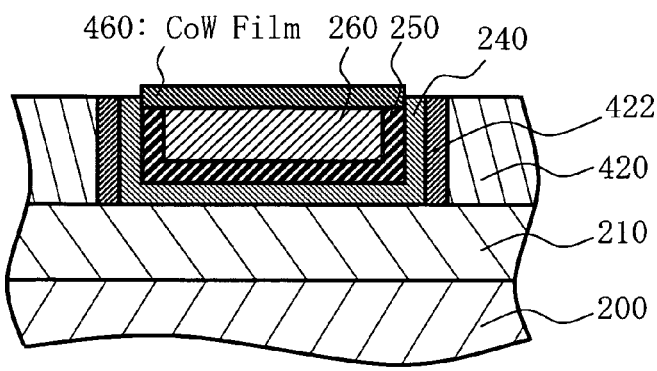

Then, as shown in FIG. 5B, a cobalt-tungsten (CoW) film 460 is selectively formed on the Cu film 260 to have its undersurface ends in contact with corresponding exposed edges of the embedded Cu seed film 250. An exemplary technique for selectively growing the CoW film 460 is to oxidize a top surface of the exposed Cu film 260 and then replace an oxide layer on the Cu film surface with cobalt (Co). In this example, the CoW film 460 is "half-buried" to have a total thickness of about 10 nm—that is, 3 nm for its buried depth (i.e., on the Cu wire side), and 7 nm for its upper exposed height (upper layer side). Another technique is to use a naturally created oxide film after the CMP process as a substitution film, without digging down the surface of Cu film 260 by additional oxidation. With the selective growth of CoW film 460 on the exposed Cu film 260, it is possible to prevent or at least greatly reduce unwanted Cu diffusion. The CoW film 460 with electrical conductivity is preferably for use as the Cu diffusion prevention film from the viewpoint of dielectric constant reduction, the film may alternatively be made of electrically insulative or dielectric materials, such as silicon nitride (SiN) or silicon carbide (SiC). In case the dielectric material such as SiN or SiC is used for the Cu diffusion prevention film, a need arises to add a process for removing portions of such diffusion preventing film which are formed at the bottom faces of via holes as defined in the Cu film 260.

Figure 5C:
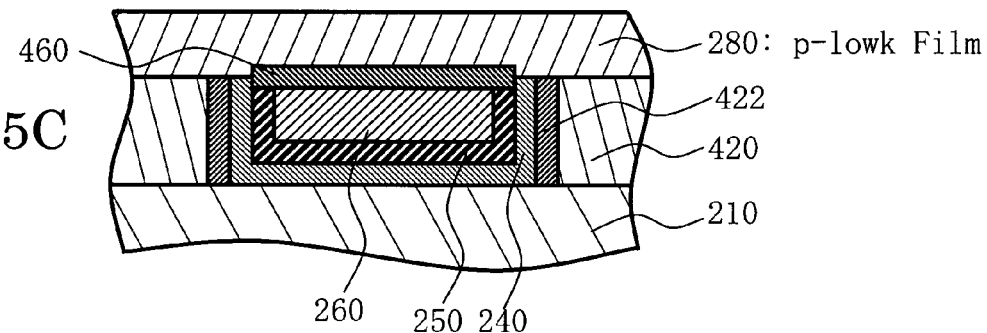

Then, as shown in FIG. 5C, a porous low dielectric constant (porous low-k or "p-lowk") film 280 is formed on an entire top surface of the resultant device structure to cover the Si film 420 and the Cu film 260 that is "capped" with CoW film 460. The p-lowk film 280 is typically made of a porous dielectric material. Forming p-lowk film 280 makes it possible to obtain an interlayer dielectric (ILD) film which has its relative dielectric constant k lower than 3.5. This p-lowk film 280 is for later use as an insulating film for providing isolation while burying therein one or more via plugs for electrical connection between upper-layer and underlayer lead wires. Thus, p-lowk film 280 is designed to have a thickness that is substantially equal to the height of such via plugs required. Here, the p-lowk film 280 is made of porous carbon-containing silicone (SiOC), which is fabricatable by CVD techniques using low-pressure CVD (LPCVD) equipment which employs a raw gas having Si—$CH_3$ couplings. Examples of an oxygen supply source used here are Si-R (where R is organic group), $CO_2$, and equivalents thereto. An oxygen-containing Si-R raw material may alternatively be employable. Desirably the film formation is done at a temperature ranging from 0 to 400° C. under a pressure of from 13.3 to $1.33 \times 10^3$ Pa (i.e., 0.1 to 10 Torr). Appropriately choosing the raw gas with adjustment of fabrication conditions enables obtainment of a porous insulator film having required physical properties.

The material of the p-lowk film 280 should not exclusively be limited to the CVD-formed SiOC which is the methylsiloxane having silicone structure. Other examples include, but not limited to, porous methylsiloxane (MSQ), hydrogen silses-quioxane (HSQ) and organic polymers, such as methylsiloxane, demethylsiloxane or else, which are formable by spin-on-dielectric (SOD) coating techniques. A thin-film of MSQ is fabricatable by an SOD method for spin-coating a chosen solution on a wafer and then applying thereto thermal processing while setting the spin rate of a spinner at 900 revolutions per minute (rpm), i.e., 900 min$^{-1}$. Then, this wafer is baked on a hot plate at a temperature of 250° C. in a nitrogen gaseous environment. Finally, curing is done on the hot plate in the nitrogen gas at 450° C. for 10 minutes. By adequately choosing the MSQ material with appropriate adjustment of fabrication parameters, it is possible to obtain the intended porous insulator film with prespecified physical properties.

The p-lowk film 280 has therein pores (holes) after gasification of the Si film 420 using a chosen etchant gas(es), which will be drained away through such pores. In view of this, the pores preferably have a diameter of 3.12 angstroms (Å) or greater; more preferably, 4 Å or more. Also note that the pores are defined to become open pores, which are opened to the outside.

Figure 5D:
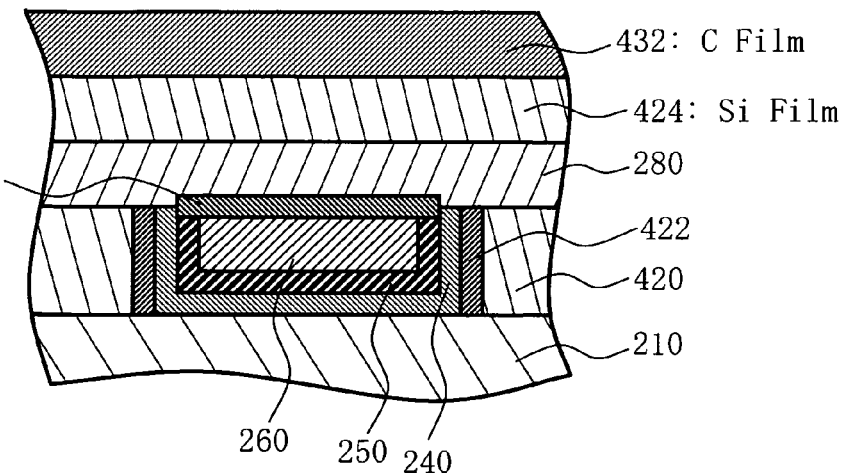

As shown in FIG. 5D, a silicon (Si) film 424 for use as a sacrifice film is formed by sputter techniques on the p-lowk film 280 to a thickness of about 250 nm, for example. The sputtering may be replaced with other suitable film fabrication techniques. The Si sacrifice film 424 also will be etched away in a similar way to the Si film 420, resulting in etched portions acting as voids or "air gaps" in the upper-level wiring layer.

Subsequently, a carbon (C) film 432 is coated on the Si sacrifice film 424. This C film 432 is for use as a mask during definition of patterned via holes in the Si film 424 as will be described later.

Figure 6A:
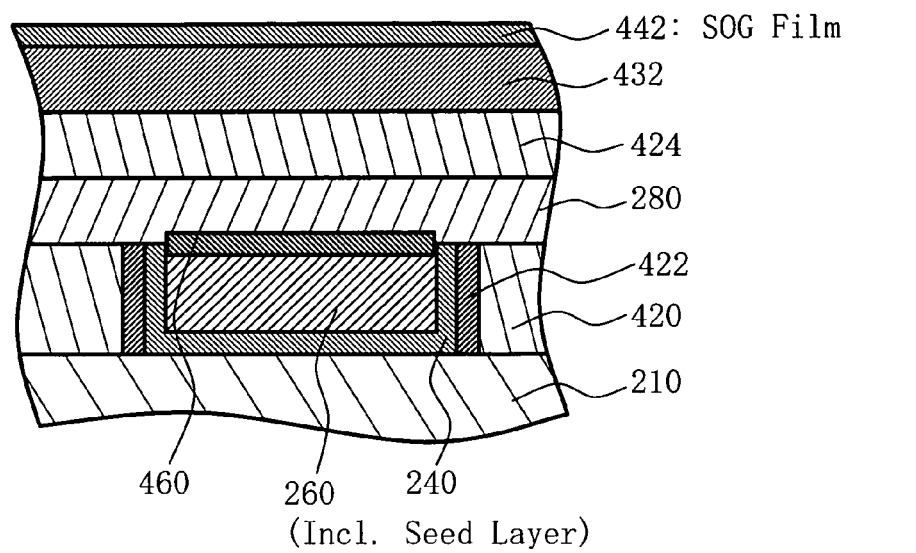
Figure 6B:
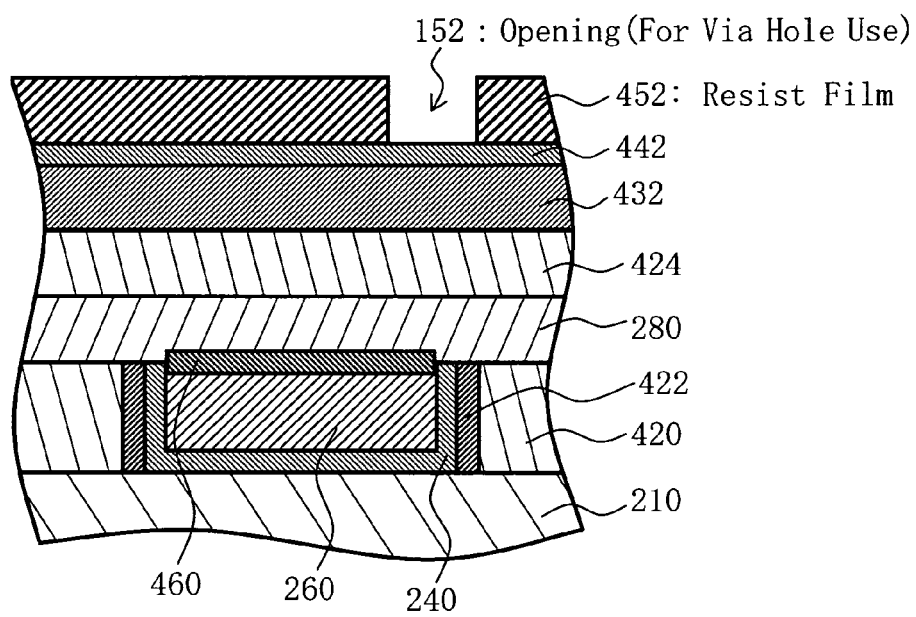
Figure 6C:
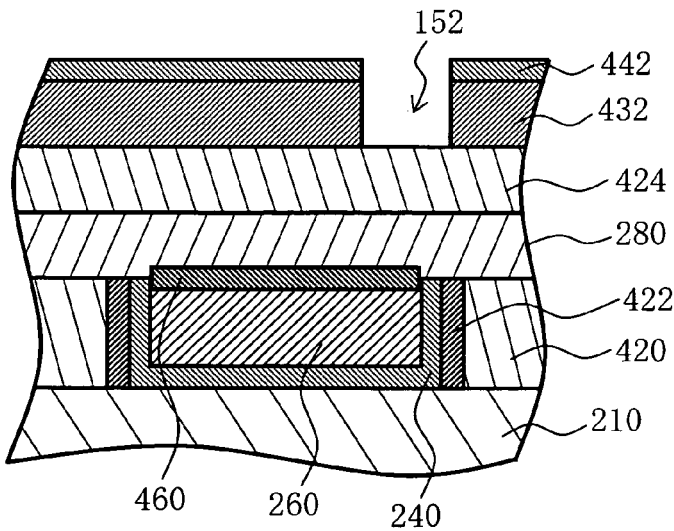

Turning to FIGS. 6A-6C, there are shown in cross-section intermediate device structures as fabricated at the SOG film forming step S130 to a partway of the opening defining step S132 in the flowchart of FIG. 1.

As shown in FIG. 6A, a semiconductive film 442 is formed on the C film 432 by silicon-on-glass (SOG) techniques. This SOG film 442 will be later used as a mask during definition of via hole pattern in the C film 432 and Si sacrifice film 424. SOG film 442 is similar in material to the above-noted SOG film 440—i.e., film 442 is made of chosen material having a silicone structure.

Then, as shown in FIG. 6B, a resist film 452 is formed to cover an entire top surface of the SOG film 442. Resist film 452 is then subjected to photolithography so that a pattern of via holes is exposed and transferred thereto. The resultant patterned resist film 442 has therein openings 152 corresponding to via holes, although only one of them is visible in FIG. 6B.

Next, as shown in FIG. 6C, with the patterned resist pattern 452 as a mask, the SOG film 442 and its underlying C film 432 are selectively etched by anisotropic etch techniques such as RIE, resulting in a pattern of through-going holes 152 being defined therein. During this etching, the resist pattern 452 is removed away.

Figure 7A:
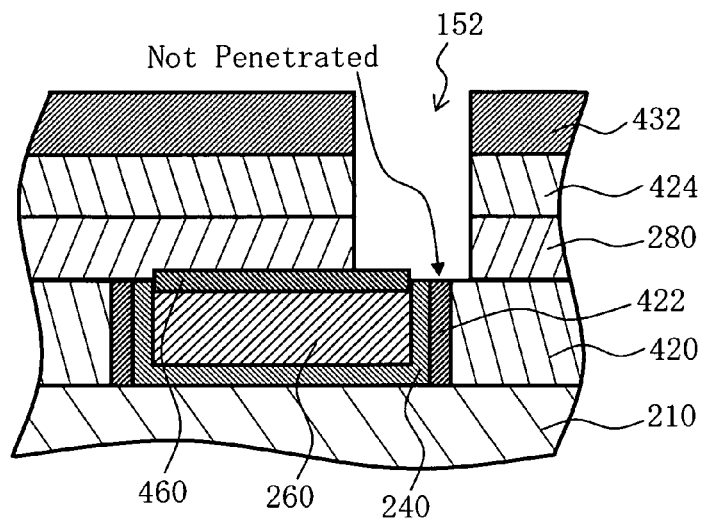
Figure 7B:
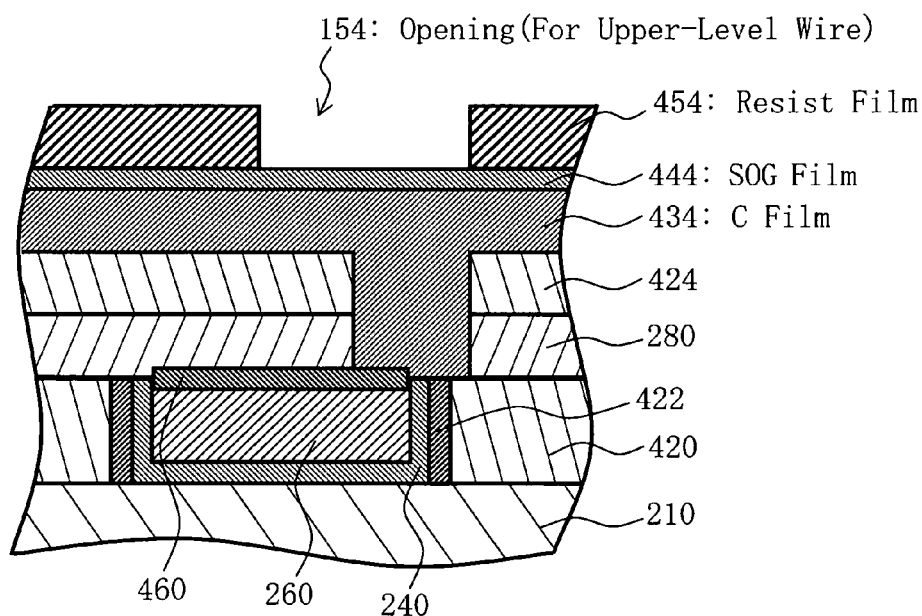

Thereafter, the process at step S132 of FIG. 1 continues, resulting in formation of device structures, which are depicted in cross-section in FIGS. 7A-7B.

As shown in FIG. 7A, with the via hole pattern-formed C film 432 as a mask, its underlying Si film 424 is selectively removed by anisotropic etch techniques. During this etching, the SOG film 442 overlying the C film 432 may be etched away. Selective anisotropic etching of Si film 424 results in opening for use as via holes being defined in Si film 424. After having selectively etched its underlying p-lowk film 280 similarly, let C film 432 be removed away by known peeling or lift-off techniques. Thus, the via hole 152 defined in the overlying C film 432 extends downward into the films 424 and 280 as shown in FIG. 7A. Regarding unwanted misalignment portions in the prior art, any extensive via-hole penetration or "overetching" is no longer occurrable in this embodiment owing to the presence of the Si film 420 immediately beneath the p-lowk film 280 at the time the via holes (i.e., through-holes) are defined.

In this step also, a multilayer mask process, such as SMAP method, is preferably employable for formation of the through-going holes (second openings) 152 by use of the C film 432 and SOG film 442 in the Si film 424 and p-lowk film 280 in a similar manner to the underlayer wiring groove formation. The remaining process conditions are similar to those in the case of forming such underlayer wiring grooves.

Then, as shown in FIG. 7B, a carbon (C) film 434 is coated on the entire surface of the Si film 424 to fill the via holes 152 in the C film 424 and p-lowk film 280. This C film 434 is for later use as a mask during formation of upper-level wiring pattern openings in the Si film 424 in a way as will be described later.

Next, an SOG film 444 is formed on the C film 434 by SOG techniques. SOG film 444 will be used together with C film 434 as the mask during formation of upper-level wiring pattern openings in the Si film 424 as will be discussed later.

After having formed a resist film 454 on the SOG 0 film 444, an upper-level wiring pattern is exposed and transferred thereto, followed by development. This results in formation of a resist pattern with openings 154 being defined therein.

Referring next to FIGS. 8A-8C, device structures are shown in cross-section, which are obtained by execution of the remaining process at the opening forming step S132 and at its following thermal processing step S134 of FIG. 1.

As shown in FIG. 8A, with the resist pattern film 454 of FIG. 7B as a mask, exposed portions of the SOG film 444 along with its underlying portions of the C film 434 are etched anisotropically. During etching of C film 434, the resist pattern 454 is etched away substantially simultaneously. The anisotropic etching is specifically controlled so that a residual portion of C film 434 remains on the bottom of each via hole. The presence of such C film portion on the via-hole bottom makes it possible to prevent an exposed top Surface portion of the lower-level Si wiring film 420 from being overetched during a subsequent Si film etch process. By etching C film 434 deeply than a bottom surface of the Si film 424 of the upper-level wiring layer, it is possible to exclude influence abilities upon the micro-patterning of Si film 424 during the next-executed Si film etching process. This makes it possible to improve Si film 424 in etched shape or profile.

Then, as shown in FIG. 8B, the exposed portions of the Si film 424 are anisotropically etched with the upper-level wiring pattern-formed C film 434 as a mask therefor. During this selective etching, the SOG film 444 which overlies C film 434 may also be etched away. Etching Si film 424 results in openings 154 for use as upper-level wiring grooves being defined in Si film 424, although only one of such openings 154 is visible in FIG. 8B.

Next, as shown in FIG. 8C, thermal processing is performed, which is one example of modified layer formation. More specifically, the C mask film 434 is removed away by known peel-off techniques. Then, the resultant device structure is subject to thermal processing, thereby to form thin-film portions of an oxide film 426 on a top surface of the wiring pattern-formed Si film 424 and on the inner wall of opening 154 defined therein. Oxide film 426 may be made of $SiO_2$. Simultaneously, an $SiO_2$ thin-film 423 is formed on a top surface of Si film 420 which is exposed within the opening 152. The thermal processing used includes ashing as in the formation of the $SiO_2$ film 422.

By modifying or "quality-improving" the surface of Si film 424 and the inner sidewall of opening 150 to form $SiO_2$ film 426 in the way stated above, the modified $SiO_2$ film 426 is placed to accurately align with sidewalls of interconnect wires as will be described in detail later. The modified film on the wire sidewalls serves as a reinforcing film for on-chip lead wires. This makes it possible for final product devices to increase in mechanical strength and in electrical characteristics, such as durabilities against electron migration (EM) and stress migration (SM). Preferably the $SiO_2$ film 426 has a thickness which is 10% or less of the distance of lead wires, as in the $SiO_2$ film 422 stated previously. An example is that when the layout pitch of wires is 100 nm (wire distance is 50 nm), the film thickness is set to 5 nm or below.

Due to misalignment in the opening formation, a top surface of the Si film 420 is exposed, which film will finally underlie via plugs which hardly overlap lead wires. On this film surface also, an $SiO_2$ film 423 is formed during the thermal processing. The $SiO_2$ film 423 is integral with and laterally extends from film 420 as a flange projecting toward the air gap side, thereby providing a "collar" with a reverse "L"-like profile by an integral combination of films 422-423. The presence of the $SiO_2$ "flange" film 423 hardens $SiO_2$ film 422 on the sidewall of barrier metal 240. This enables the wire reinforcing film to have further improved mechanical strength. Very importantly, the flange-like $SiO_2$ film 423 is formed at part of a region that will finally become an air gap between wires, rather than on an entirety of such gap region. This makes it possible to avoid unwanted increases in dielectric constant while at the same time achieving enhanced reinforcement of wires.

Figure 9A:
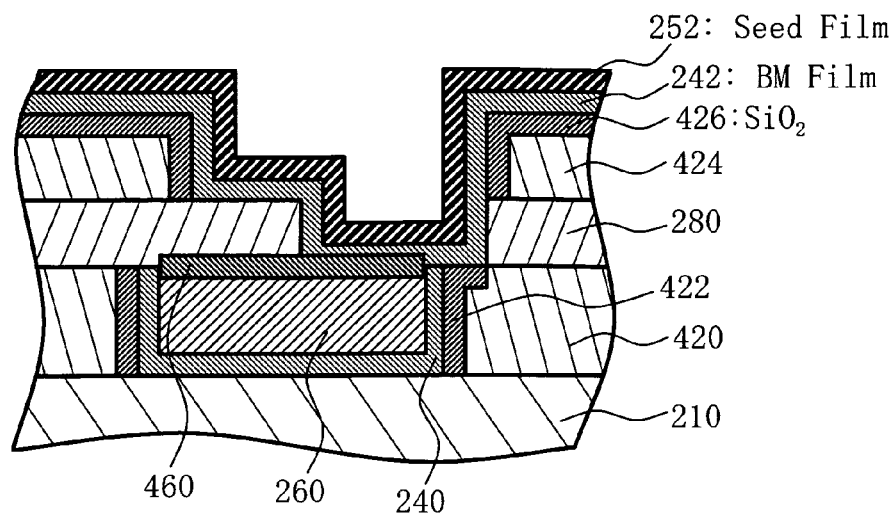
Figure 9B:
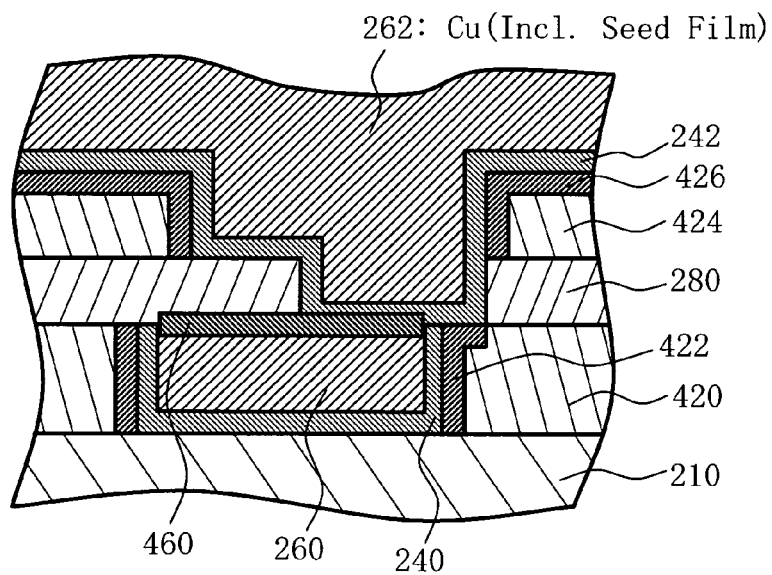
Figure 9C:
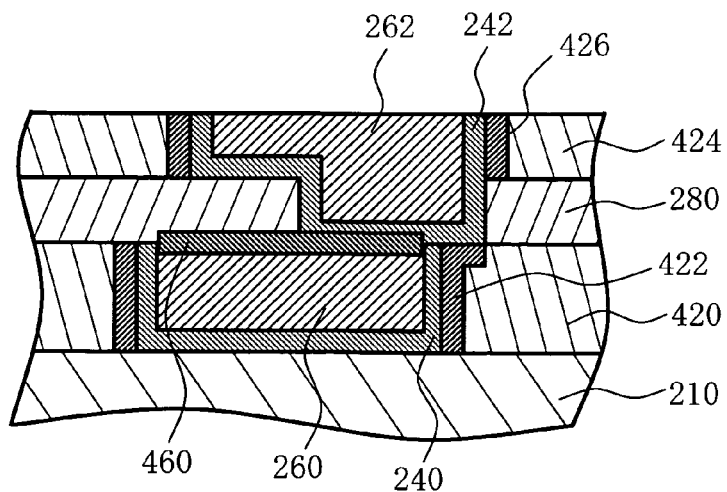

See FIGS. 9A-9C, which depicts cross-sectional structures obtained at the barrier metal forming step S136 through planarization step S142 of FIG. 1.

As shown in FIG. 9A, a film 242 of barrier metal (BM) material is formed on a top surface of the resultant device structure including the $SiO_2$ film 426 in such a way as to cover the exposed surfaces of openings 152 and 154. The BM film 242 is made for example of tantalum (Ta) with a thickness of about 10 nm, which is deposited by sputter techniques to a thickness of about 10 nm, as in the formation of the BM film 240 of FIG. 4B.

Then, physical vapor deposition (PVD) such as sputtering is performed to deposit a copper (Cu) thin-film 252 on the BM film 242. Thus the BM film 242-formed inner walls of openings 152 and 154 are buried under the Cu film 252. This film 252 is for later use as a seed film of a cathode pole during an electrolytic plating process to be next performed.

Then, as shown in FIG. 5B, with the seed film 252 as the cathode pole, electrolytic plating is carried out to permit a Cu film 262 to electrochemically grow on the BM film 242 covering the surfaces of the openings 152 and 154, to a thickness large enough to full these openings 152 and 154. For example, the Cu film 262 deposited is about 500 nm thick, to which annealing is applied at a temperature of 250° C. for 30 minutes.

Next as shown in FIG. 9C, the resulting device structure is planarized by chemical-mechanical polish (CMP) techniques so that the thick Cu film 262 and its underlying stacked films—i.e., the seed film 252, BM film 242 and $SiO_2$ film 426—are at least partially removed away. This results 55 in formation of a multilayer buried structure having a flat top surface as shown herein. More specifically, the polished top surface of Cu film 262 is flush with those surfaces of films 242, 426 and 424.

Figure 10A:
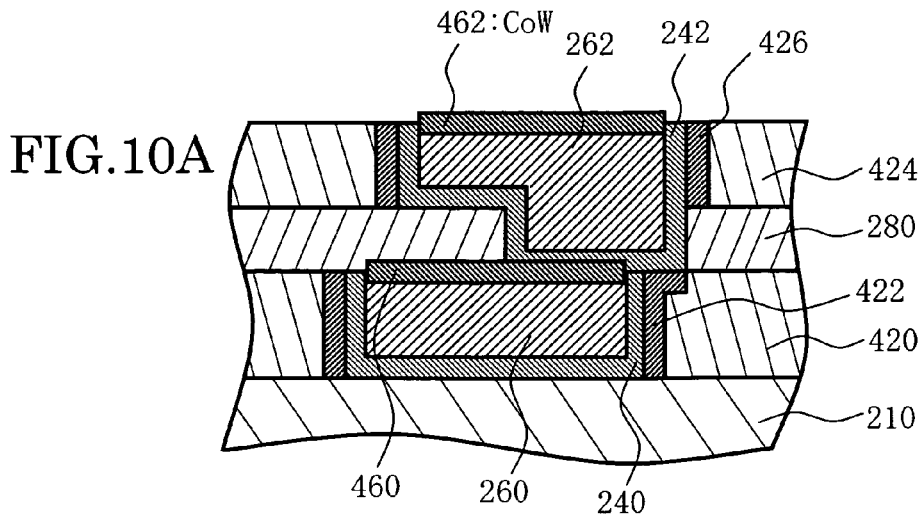
Figure 10B:
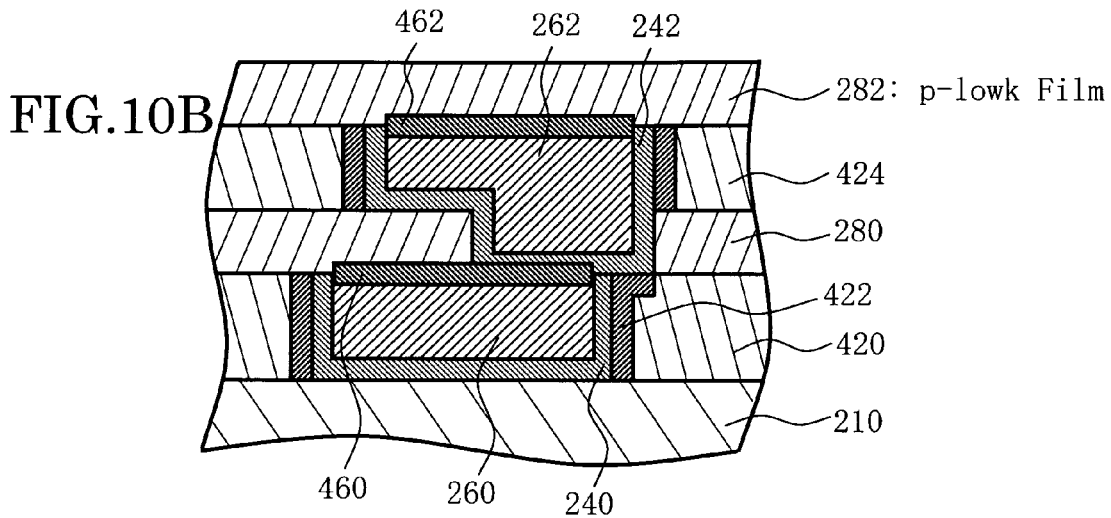
Figure 10C:
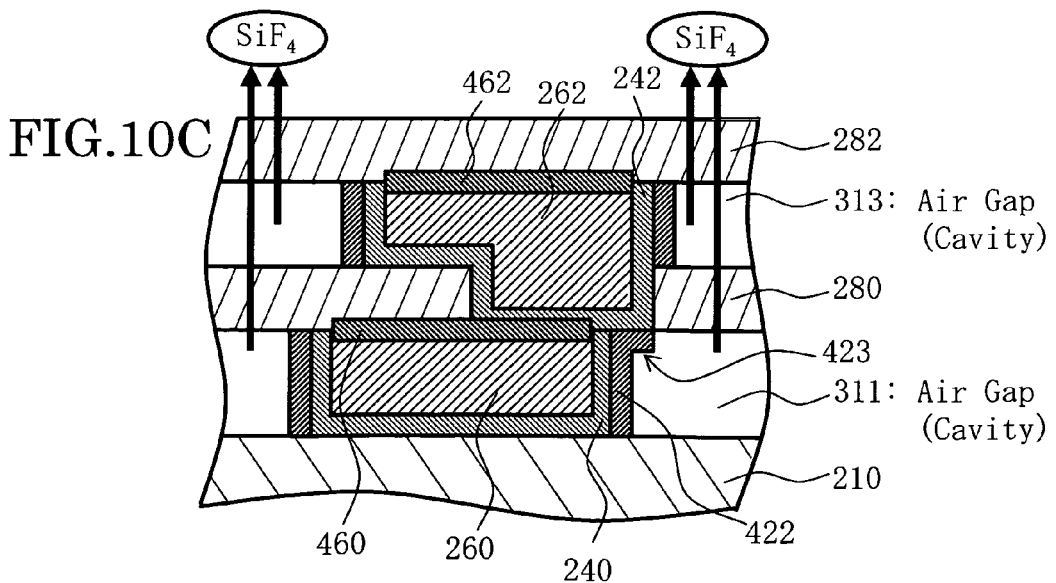

See FIGS. 10A-10C which illustrate in cross-section the cobalt-tungsten (CoW) film forming step S144 to the etching step S148 of FIG. 1.

As shown in FIG. 10A, a CoW film 462 is selectively formed on the Cu film 262 as a "cap" thereof. More specifically, as in the case of the CoW film 460, the Cu film 262 is oxidized on its exposed surface, thereby forming an oxide layer thereon. This oxide layer is then replaced or "substituted" by cobalt (Co), allowing selective growth of the CoW film 462, which covers only the top surface of film 262. Typically the CoW cap film 462 is approximately 3 nm in thickness on the Cu wire side and is about 7 nm thick on the overlayer side to thereby have a total thickness of about 10 nm as in the CoW film 460. The selective growth of CoW film on the exposed surface of Cu film 262 enables preclusion of unwanted Cu diffusion for the same reason stated previously.

Then, as shown in FIG. 10B, a low dielectric constant (low-k) film 282 is formed on top surfaces of Si film 424 and CoW-capped Cu film 262. The low-k film 282 may be made of porous insulative or dielectric material. Forming such p-lowk film 282 results in obtainment of an interlevel dielectric (ILD) film having its relative dielectric constant k, being lower than 3.5. This p-lowk film 282 is for later use as a dielectric film for electrical insulation of buried via plugs overlying the upper-level wiring layer. The p-lowk film 280 is similar in other features to the p-lowk film 280 stated supra.

Then as shown in FIG. 10C, the resulting device structure is applied dry etching for removing by "vaporization" the buried Si films 420 and 424 to thereby form cavities or voids—say, air gaps—311 and 313. The dry etch-aided removal of Si films 420 and 424 after having formed the multilayer interconnect wires is achievable through pores or "bubbles" that exist inherently within the p-lowk films 282 and 280, while using a fluorine-containing etching gas. An example of the etchant gas is xenon fluoride ($XeF_2$).

Figure 11:
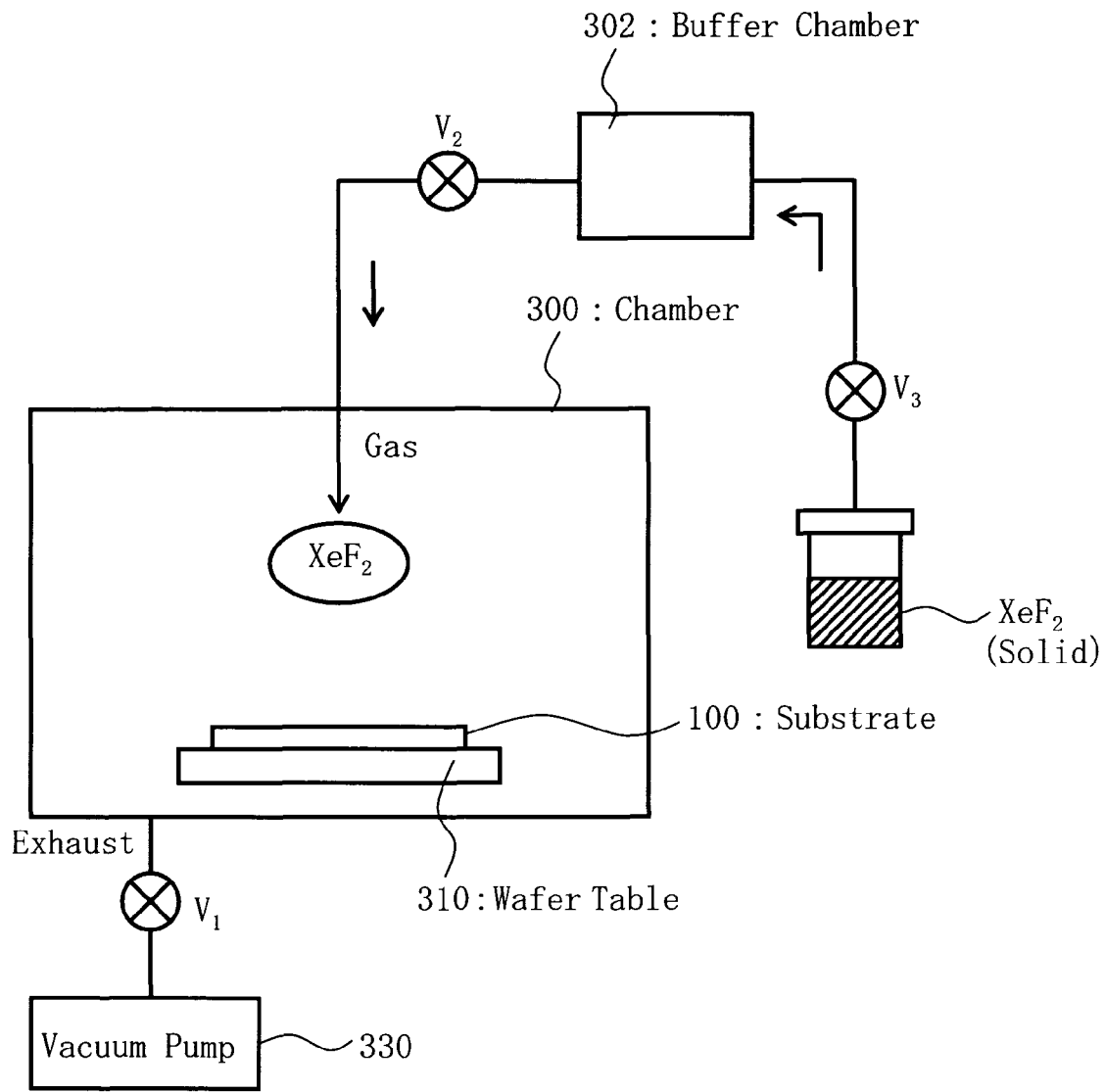
FIG. 11 is a diagram schematically showing a structure of etching equipment used.

Turning to FIG. 11, an etching apparatus used for fabrication of the semiconductor device discussed above is shown. The etcher apparatus includes a vacuum chamber 300 which has therein a wafer supporting/holding table 310, which is temperature-controlled to stay at about 60° C. A silicon wafer or substrate for use as a base body 100 is mounted on the table 310. Chamber 300 has a gas intake pipe with a valve V2 and a gas exhaust or outtake pipe with a valve V1. The gas intake pipe is coupled via a buffer chamber 302 to a gas source vessel, with a control valve V3 interposed therebetween. This gas source contains therein raw material of $XeF_2$ that is a solid at room temperatures. The gas outtake pipe is coupled through the valve V1 to a vacuum pump 330. While letting valve V1 be opened with valve V1 closed, vacuum pump 330 is activated to evacuate the interior space of main chamber 300 to a reduced pressure of about $1.33 \times 10^{-5}$ Pa (i.e., $1 \times 10^{-7}$ Torr). Then, open valve V3 while valve V2 is closed. Thus a sublimated gas of $XeF_2$ is introduced into the interior of buffer chamber 302 so that it is filled with the $XeF_2$ gas. Then, open valve V2 with valves V1 and V3 closed, resulting in the $XeF_2$ gas being introduced into chamber 300 by a differential pressure. Using this $XeF_2$ gas as an etching gas, etch the Si films 420 and 424 in the way as described in conjunction with FIG. 10C.

Figure 12:
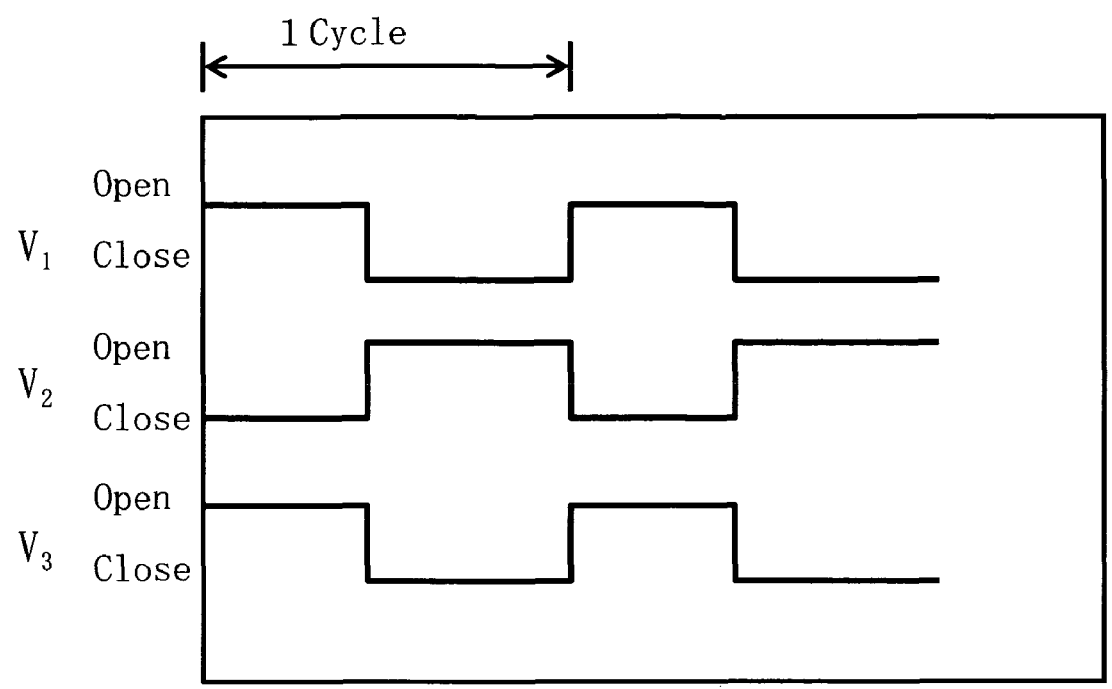
FIG. 12 graphically shows a flow of valve open/close operations of the etcher shown in FIG. 11.

See FIG. 12, which is a timing diagram of the gas flow control valves V1-V3 of the etcher shown in FIG. 11. As shown herein, during evacuation of the main chamber 300 by the vacuum pump 330 to provide an internal pressure of $1.33 \times 10^{-5}$ Pa ($1 \times 10^{-7}$ Torr), the gas exhaust valve V1 is opened while letting the gas intake valve V2 open. Thereafter, open valve V3 while valve V2 is closed, thereby to introduce the $XeF_2$ gas into the buffer chamber 302 to fill it with such gas. Then, close valves V1 and V3 and open valve V2, resulting in the XeF$_2$ gas being introduced into chamber 300 due to a pressure difference. One cycle of evaluation operation is completed when main chamber 300 and buffer chamber 302 becomes the same in pressure as each other. Such operation will be repeated an appropriate number of times, which is determinable depending upon the size dimension of a target substrate—more precisely, a total volume of the Si films 420 and 424 to be etched for formation of air gaps. An example is that the evacuation cycle is repeated sixteen times in case two layers on a 300-mm silicon wafer are hollowed or "cavitated" by using main chamber 300 with its volume of 20 liters and buffer chamber 302 of 1 liter.

The behavior of an etching gas for air gap creation will be described in detail with reference to FIGS. 13A-13D below.

Figure 13A:
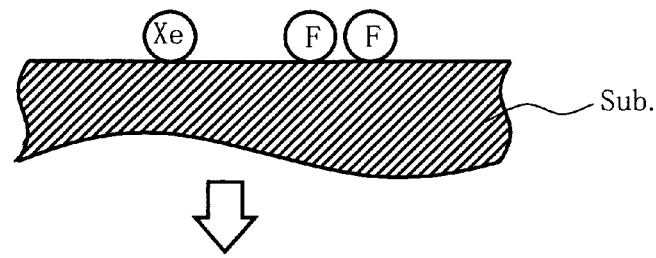
FIGS. 13A-13D are diagrams each pictorially showing in detail a cross-sectional structure during etching.
Figure 13B:
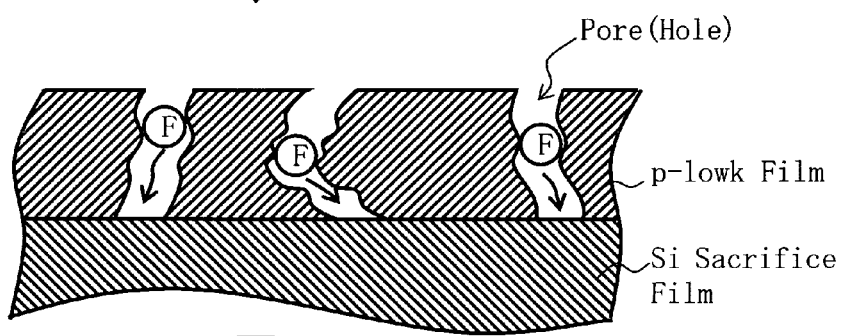
Figure 13C:
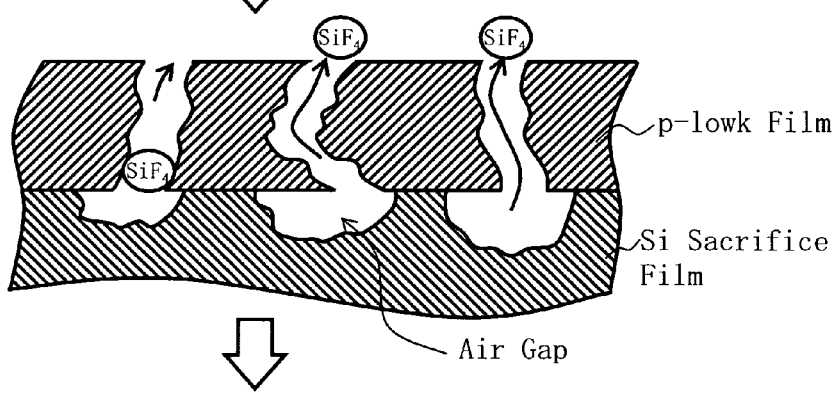
Figure 13D:

As shown in FIG. 13A, the etching gas of XeF$_2$ is attached and absorbed into the surface of a p-lowk film made of a chosen porous material. Upon absorption of the XeF$_2$ gas, this is disassembled into Xe and F$_2$ molecules as shown. Then, as shown in FIG. 13B, fluorine (F) atoms in F$_2$ molecules act as etchant to pass through pores of the p-lowk film and then approach its underlying Si sacrifice thin-film. When reaching a surface of the Si sacrifice film, the etchant gas etches or "breaks" it while spreading around the surface as shown in FIG. 13C. This etching results in production of gaseous molecules of SiF$_x$, e.g., SiF$_4$, which behave to move upward through the pores of p-lowk film, followed by outward release or eduction. Outward discharge of such gasified SiF$_x$ molecules leads to creation of air gaps at their corresponding locations in the p-lowk film. Next, as shown in FIG. 13D, the remaining part of such Si sacrifice film is etched away while permitting the modified SiO$_2$ film 426 to remain continuously, thereby to form the air gap 313 shown in FIG. 10C.

Figure 14A:
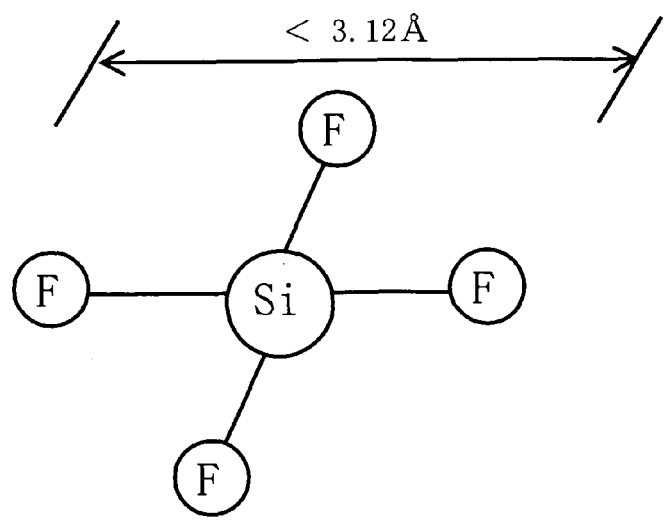
FIG. 14A depicts a model of gasified molecule structure.
Figure 14B:
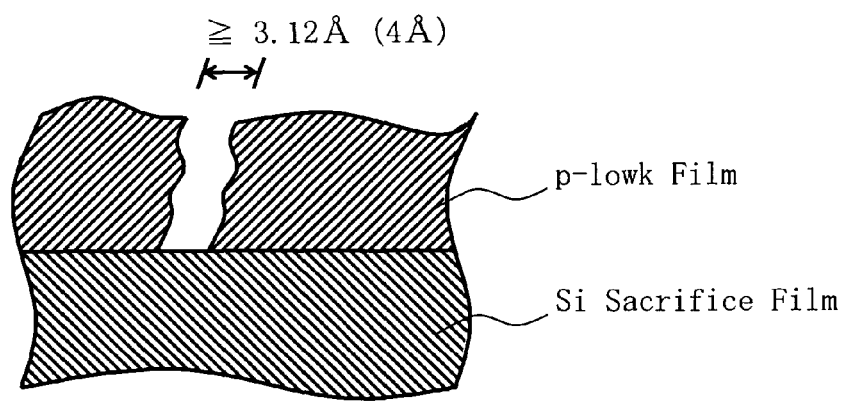
FIG. 14B shows a partial cross-section of an intermediate product device with a gas "loophole" defined therein.

The gasified molecules during etching of the entire Si sacrifice film may typically have a molecular structure such as shown in FIG. 14A. These gaseous molecules are externally removed away through the pores, of p-lowk film, resulting in the p-lowk film having therein upstanding hollow serpentine portions or "loopholes" with its pore diameter equal to or greater than the size of such gasified molecules. For example, in case SiF$_4$ is produced through reaction of XeF$_2$ and Si, Si—F is expected to have a molecule size of about 1.56 Å. In this case, the SiF$_4$ can experience shrinkage, so its molecule size is less than 3.12 Å, which is twice the Si—F molecule size. Accordingly, as shown in FIG. 14B, the p-lowk film may measure 3.12 Å or more in pore diameter. More preferably, this film is 4 Å or greater in pore diameter in view of the fact that the molecules reciprocally pass through the pores of p-lowk film resulting in creation of open pores therein.

Figure 15:
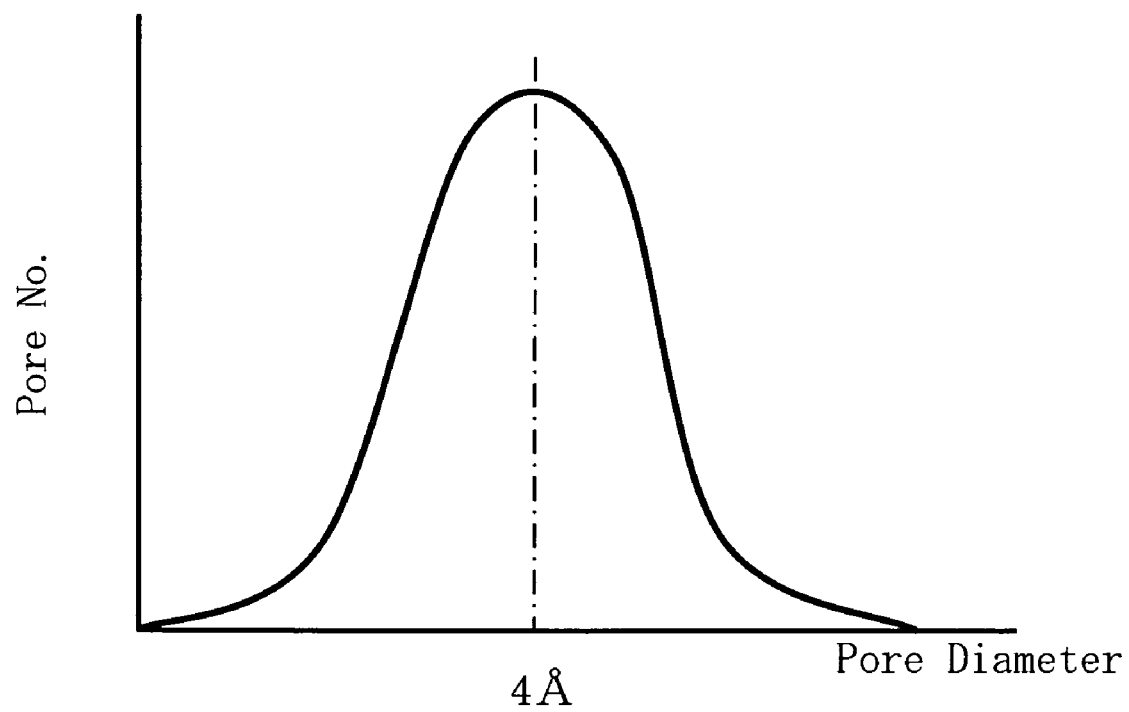
FIG. 15 is a graph showing a curve of the pore number versus the pore diameter of a porous low dielectric constant (p-lowk) film.

See FIG. 15, which is a graph showing a typical plot of the pore number versus the pore diameter of p-lowk film. Generally the p-lowk film formed is not uniform but variable in diameter of pores contained therein. In view of this, it is preferable that this film exhibits a distribution of pore diameter values with a target value (here, 4 Å) as its center, although the center pore diameter size may be set higher as far as the mechanical strength permits. An approach to controlling the pore diameter is to add to the p-lowk film certain material for accelerating creation of pores or voids therein. Alternative approach is to optimize the molecular mass or weight (i.e., molecule size dimensions).

An example of the pore-creation accelerator material adding approach is as follows. The p-lowk film is fabricated by CVD techniques using a mixture gas of methyl-di-ethoxy silane (m-DEOS) and alpha-terpinene (ATRP) plus oxygen. The m-DEOS and oxygen are devoted to formation of the silicone structure required. ATRP acts to produce porogens. At this process stage, the p-lowk film has no pores therein. By letting it undergo a post-treatment, i.e., curing using an electron beam (EB) or ultraviolet (UV) ray, ATRP components within the p-lowk film disappear, resulting in creation of pores therein. These pores are controllable in diameter by appropriate selection of the kind of porogen. Regarding the void content, this is controllable by adequately designing the gas mixture ratio of a process gas along with process parameters of the EB/UV curing treatment.

In the case of the molecular weight-based pore diameter control approach, more than two kinds of materials which are different in molecular weight (molecule diameter) from each other are blended together to provide a mixed material, which is coated or "painted" on a target layer and is then baked to thereby form the intended p-lowk film. This film has pores, the diameter of which is controllable by adequate selection of the coating material.

The resulting p-lowk film has Si—O structured major components with a binding energy of about 8.29 electron-volts (eV), which is greater than those of an Si—Si structure-based Si sacrifice film and the gasified molecules (SiF$_x$) with Si—F structured main components, wherein the former is 3.39 eV in bind energy whereas the latter is 5.73 eV. Owing to such large bind energy, the p-lowk film is hardly etched away. Thus it is possible to selectively remove only the Si sacrifice film by utilizing the pores in the p-lowk film.

In gas-phase etching processes without accompanying discharge, F$_2$ gas is also employable in place of XeF$_2$. In the case of chemical dry etching (CDE) which requires dissociation due to discharging, several kinds of etchant gasses may be used, such as CF$_4$, SF$_6$, Cl$_2$, HCl or other similar suitable ones. Additionally in cases where the dissociation by discharging is needed, down-flow processing is desirable.

Figure 16:
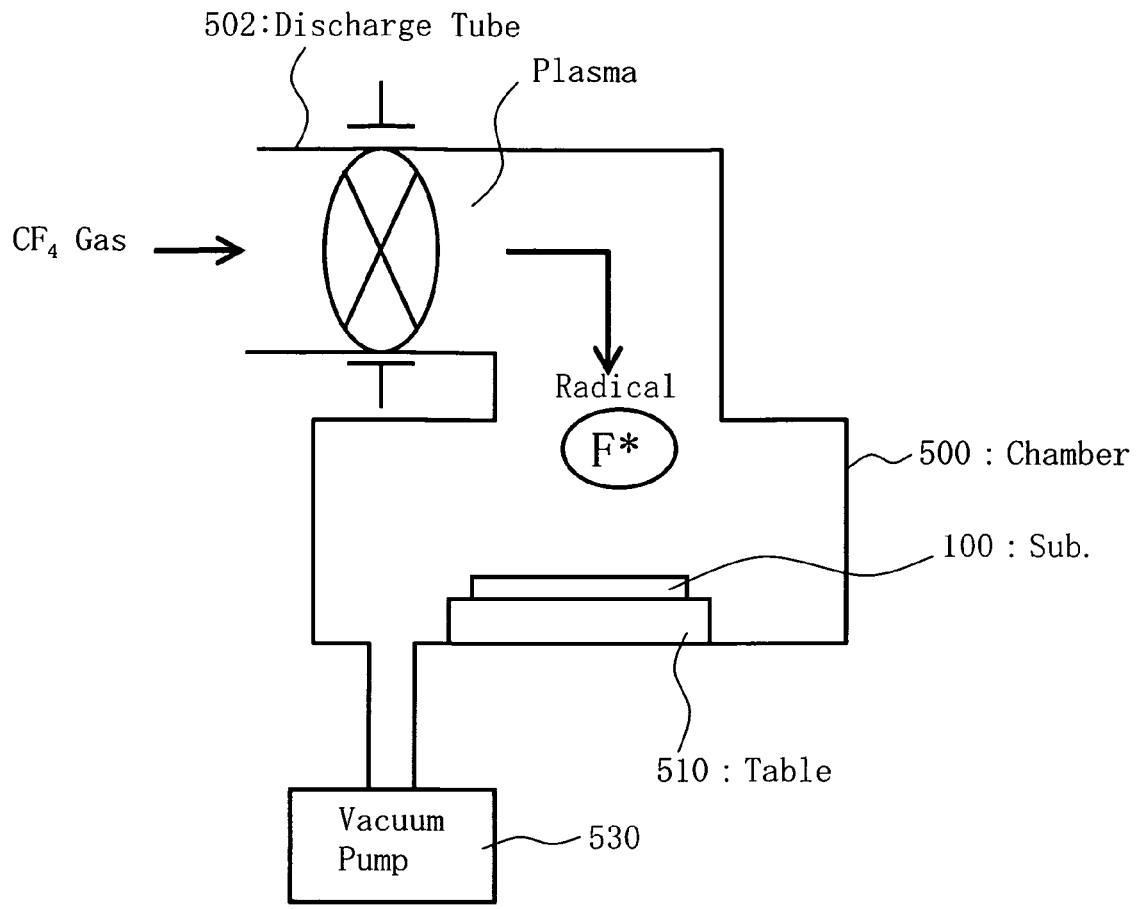
FIG. 16 is a diagram showing a structure of etching equipment.

Turning to FIG. 16, main part of an etching apparatus is shown. This etcher includes a main chamber 500 having therein a substrate holding table 510. The interior space of chamber 500 is evacuated by a vacuum pump 520 to an extra-low pressure ranging from about 13.3 Pa (100 mTorr) to 26.6 Pa (200 mTorr). A target wafer or substrate 100 is stably mounted on the table 510. Chamber 500 has a raw gas inlet pipe, which is coupled to an electric discharge tube 502. This discharge tube 502 is spaced far from the table 510 and is "invisible" from the substrate 100 being processed. Discharger 502 creates a plasma, which dissociates an etching gas of CF$_4$, for example, resulting in production of fluorine radicals (F*) of active species having no directionalities. These radicals F* are used to etch an Si sacrifice film. This etching uses down-flow processing techniques, so it is possible to etch the Si sacrifice film by using the radicals F*. This in turn makes it possible to suppress or minimize unwanted impact or collision of ions with directionality with the p-lowk film. Especially, setting the internal pressure of chamber 500 to the above-specified level makes it possible to establish the intended average free path that is large enough to enable neutralization of residual ions therein. The ability to suppress collision of ions with the p-lowk film reduces or avoids the risk as to etching of p-lowk film by those ions having kinetic energies.

Figure 17:
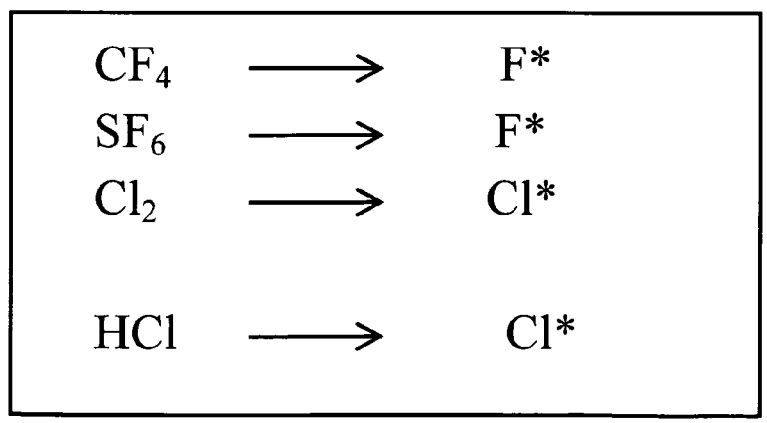
FIG. 17 shows, in chemical formula form, active species of an etching gas which requires dissociation by means of discharging.

Some examples of the active species of the etching gas as preferably employable in this embodiment, which requires dissociation by discharge, are shown in FIG. 17. While CF$_4$, SF$_6$, Cl$_2$ and HCl gases are exemplified here as the discharge-assisted dissociation necessary etchant gas, CF$_4$ and SF$_6$ produce fluorine radicals F* whereas Cl$_2$ and HCl create chlorine radicals Cl* for etching of the Si sacrifice film.

Figure 18A:
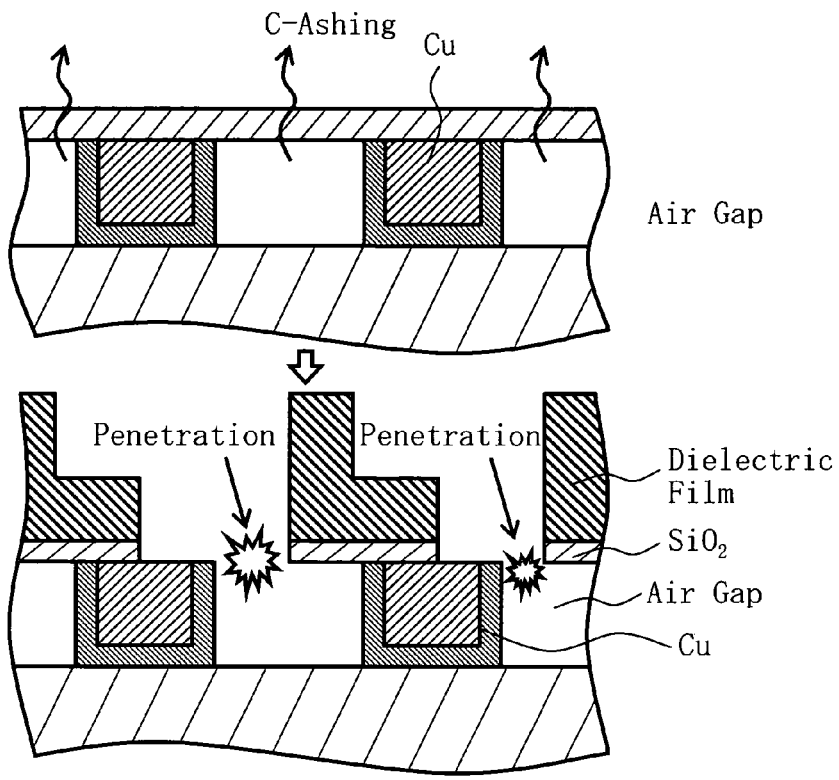
FIG. 18A-18B are diagrams showing cross-sectional device structures for comparison with the prior art.
Figure 18B:
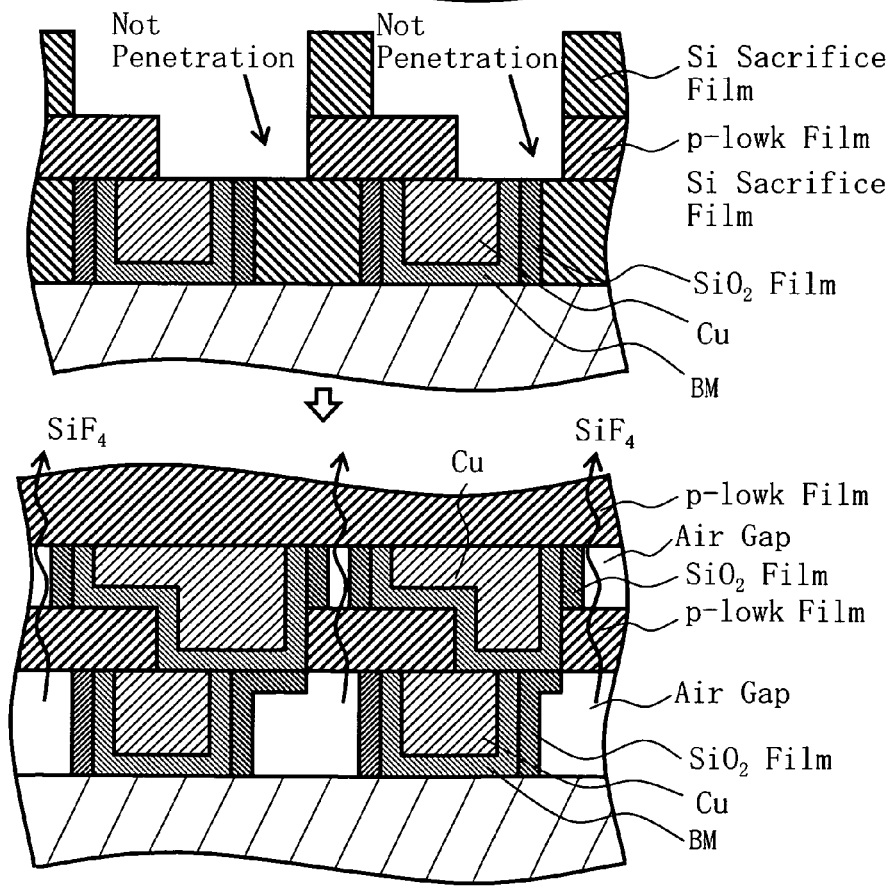

For comparison purposes, a prior art method for forming a multilayer wiring pattern after having defined voids in a lower-level wiring layer is shown in FIG. 18A. When misalignment occurs during formation of via holes in an overlying dielectric film, the via holes behave to completely penetrate and break an interlevel $SiO_2$ film, resulting in occurrence of shoot-out or "punching." This causes the via holes to extend to their underlying air gaps that, have already been defined in the low-level wiring layer. This via-hole penetration risk is avoidable by a corresponding process of the embodiment method shown in FIG. 18B. This can be said because the Si sacrifice film resides at the low-level wiring layer during formation of via holes in the upper-level dielectric film, thereby precluding the unwanted penetration of via holes. Additionally, as the voids are defined after having formed the upper-level wiring layer, it is possible to successfully fabricate the intended air gap structure of multilayer wiring layer.

Use of the above-noted embodiment method makes it possible to remove both the Si film 420 of low-level wiring layer and the Si film 424 of upper-level wiring layer at a time through the p-lowk films 282 and 280 even after having formed dual damascene lead wires. Owing to the air-gap formation after the formation of such wiring structure, the air gap structure is applicable even to dual damascene device structures, which have been faced with difficulties in microfabrication and miniaturization during pattern formation. In other words, in the dual damascene patterning process, it is possible to increase the tolerance against any possible misalignment with underlying interconnect wires.

Also importantly, at the filling step S150 of FIG. 1, a gas of chosen material, e.g., argon (Ar), is introduced to fill resultant voids or cavities—i.e., the air gaps 311 and 313 such as shown in FIG. 10C. Other examples of such filling gas are nitrogen ($N_2$), oxygen ($O_2$) and atmospheric air. Mainly using these gases permits the resulting gas-filled air gaps 311 and 313 to have the relative dielectric constant k which is lowered to about 1.0. In the case of Ar used for infilling purpose, this may be introduced in such a way that the resultant Ar gas density within the voids is higher than at least the density in the air (atmosphere). An alternative approach to filling the voids with the air (in particular, dried air) is to let these voids come into contact with the ambient air during device fabrication. Another approach is to provide an aperture(s) in a chip package. One example of such gas-filling process is that the air gaps are exposed to a gaseous environment after completion of the etching process for void/cavity formation. Alternatively, it is also applicable to expose them to an environment of at least one of Ar, $N_2$ and $O_2$ during etching for void formation.

A semiconductor device thus fabricated by the method in accordance with the embodiment 1 of the invention is such that an inactive gas or air is mainly filled in between interconnect lead wires. This gas or air is about 1.0 in relative dielectric constant k. This makes it possible to greatly reduce or minimize the dielectric constant when compared to devices of the type having a dielectric layer of silicon oxides or else for infilling between interconnect wires. Thus it is possible to increase both the integration density of on-chip circuit elements and the performance of ultralarge-scale integrated (ULSI) chip at a time.

Embodiment 2

Figure 19A:
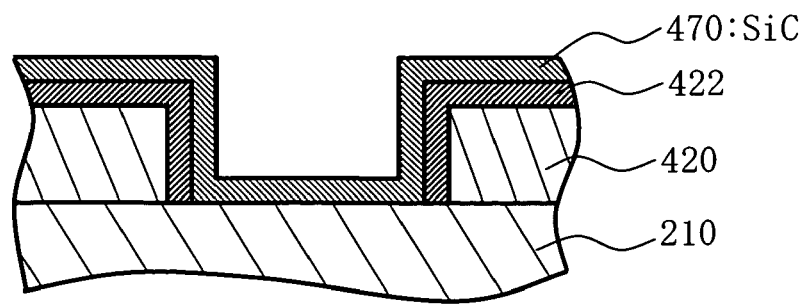
FIGS. 19A-19C illustrate in cross-section some process steps in the manufacture of a semiconductor device in accordance with an embodiment 2 of the invention.
Figure 19B:
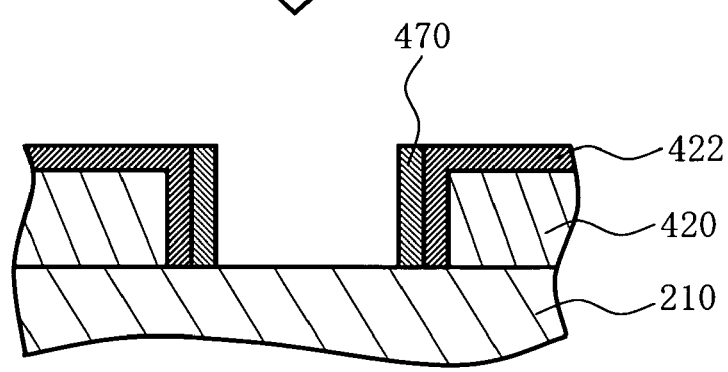
Figure 19C:
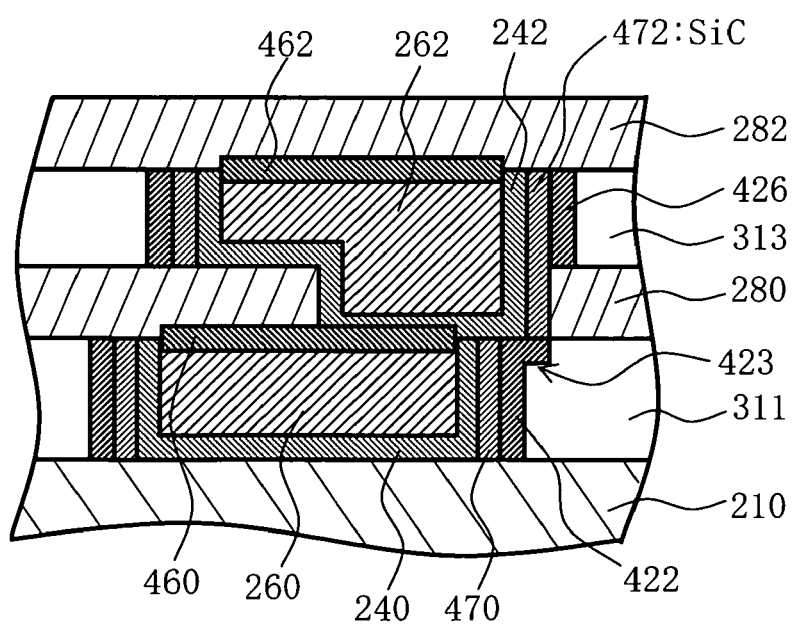

A semiconductor device fabrication method in accordance with an embodiment 2 of the invention is shown in FIGS. 19A-19C, which illustrate in cross-section some major process steps thereof. Generally this embodiment is similar to that of the embodiment 1 with a further wire-reinforcing SiC film as a second reinforcing film being used in addition to the Si sacrifice film-modified $SiO_2$ film 422 and $SiO_2$ films 423 and 426.

As shown in FIG. 19A, an SiC film 470 is formed by CVD or like techniques on the $SiO_2$ film 422 which is a modified layer of the Si sacrifice film as stated previously in conjunction with FIG. 4A in such a manner as to fully cover the top surface of film 422 along with the inner walls of openings as defined therein. This film 470 is for use as an additional reinforcing film and is deposited to a prespecified thickness, which is preferably about 10% or less of the distance of on-chip interconnect wires as stated supra. Hence, a total thickness of $SiO_2$ film 422 and SiC film 470 is less than or equal to 10% of the wire distance. For example, when the wire pitch is 100 nm (wire distance is 50 nm), the total film thickness is desirably set to 5 nm or less.

Then, as shown in FIG. 19B, the SiC reinforcing film 470 is selectively removed by etch-back techniques, resulting in its portions being resided only on the inner walls of openings while having a "collar"-like shape. Adding this SiC collar film 470 enables further enhancement of the wire reinforcement.

A similar process is performed after having formed the device structure of FIG. 8C (corresponding to the thermal processing step S134 of FIG. 1), thereby to form an SiC reinforcing collar film 472 in the upper-level wiring layer. This results in fabrication of a semiconductor device with increased SiC-film reinforcement of the overlying and underlying wires and via plugs as shown in FIG. 19C.

As apparent from the foregoing, the illustrative embodiments stated above are each arranged to form voids or cavities known as the "air gaps" by removal of the Si sacrifice film after having deposited the layer of conductive material to bury those openings for use as via holes. Due to the presence of such Si sacrifice film, it is possible to prevent unwanted penetration of via holes into the air gaps. In other words, by defining voids in the lower-level wiring layer after formation of the via plugs and upper-level wiring layer, it becomes possible to prevent via plug material from entering or "invading" the voids in the lower-level wiring layer. This makes it possible to achieve highly accurate microfabrication of on-chip lead wires. It is also possible to retain or "conserve" the voids, which leads to an ability to successfully fabricate semiconductor devices of the type using the air gap structure.

Although in the above description the oxide film for use as a modified film is formed on the surface of Si sacrifice film, this film is eliminatable. Even in such case, similar advantages are obtainable as far as the penetration prevention during opening formation is concerned.

While in the embodiments the air gaps are formed in two lower-level and upper-level wiring layers (first and second wiring layers), the concept of such air-gap formation is also applicable to multilayer structures of more than three stacked wiring layers. In particular, the penetration occurring due to misalignment is avoidable by forming such air gaps by simultaneous etching of the Si sacrifice film after having formed every wiring layer involved.

The barrier metal used is not limited to Ta or TaN and may alternatively be high-melting-point metal films or carbonitride films, such as tantalum carbonitride (TaCN), tungsten nitride (WN), tungsten carbonitride (WCN), titanium nitride (TiN) or equivalents thereof. Other examples are titanium (Ti) and WSiN or else.

While the wiring layers in each embodiment are made of Cu, this may be replaced by Cu-containing materials used in the currently-established semiconductor fabrication processes, such as Cu—Sn alloys, Cu—Ti alloys, Cu—Al alloys or equivalents thereto.

In the case of a multilayer wiring structure having many stacked layers, the substrate 200 as shown in FIG. 4A et seq may be replaced by a stacked substrate or wafer with a lamination of a conductive wiring layer and its overlying insulative film.

While the porous dielectric film material used in the illustrative embodiments is SiOC or MSQ, other organic or inorganic insulative materials with porosity may be used. Even with these materials, similar results are obtainable.

In particular, in case a porous low-dielectric-constant material is employed for each embodiment, remarkable effects and advantages are attainable as stated previously. Examples of such porous dielectric material are various kinds of silses-quioxane compounds, polyimide, fluorocarbon, parylene, benzocyclobutene and equivalents thereto.

As stated above, according to the embodiments, it is possible to prevent the downward penetration to voids or air gaps otherwise occurring due to misalignment during formation of upper-level interconnect wires in the prior art. In other words, it is possible to form multilayered on-chip leads while at the same time precluding conductive material of the upper-level wires from gaining entry to cavities between lower-level interconnect wires. These cavities are well retainable, so it is possible to lower the dielectric constant, thereby enabling effective fabrication of air-gapped semiconductor devices. In addition, by disposing the reinforcing film having its flange portion projected toward the cavity side, it is possible to improve the mechanical strength of wires while bridling an increase in dielectric constant.

While the invention has been described with reference to specific embodiments, the description is illustrative of the invention and is not to be construed as limiting the invention.

For example, the interlayer dielectric film-formed substrate 200 is replaceable by those having various types of semiconductor circuit elements or structures, not shown. Additionally the via holes should not necessarily be formed in the lower-level wiring layer. Dummy via plugs with no interconnection to lower-level wires may be disposed to overlie the cavities of lower-level wiring layer.

Regarding to the interlayer dielectric film thickness and the size, shape and number of the openings also, these are modifiable in a way pursuant to requirements for semiconductor integrated circuits and various types of semiconductor elements on a case-by-case basis.

It is appreciated that any variants of the semiconductor device fabrication method which comprise the essential process steps of the invention and are design-changeable by technicians in the art are construed to be involved in the scope of the invention.

Although currently available processes in the semiconductor device art, e.g., photolithography and pre- and post-cleaning processes, are not specifically illustrated for brevity purposes of the description, such techniques may be involved in the invention.

Additional advantages and modifications will readily occur to those skilled in the art. Therefore the invention in its broader aspects is not limited to the specific details and representative embodiments shown and described herein. Accordingly, various modifications may be made without departing from the spirit and scope of the general inventive concept as defined by the appended claims and equivalents thereto.

What is claimed is:

1. A semiconductor device having a substrate, comprising:
   a plurality of conductors arranged in a plane parallel to the substrate, two adjacent ones of the conductors defining a cavity therebetween;
   a reinforcing film comprising:
      a sidewall portion disposed adjacent to and parallel to a sidewall of at least one of the two adjacent conductors; and
      a flange portion projecting from the sidewall portion toward the cavity; and
   a via plug connected to the at least one of the two adjacent conductors and provided on the flange portion.

2. The device according to claim 1, further comprising:
   a second reinforcing film disposed between the sidewall of the at least one of the two adjacent conductors and the side wall portion.

3. The device according to claim 1, wherein the via plug is buried in a porous dielectric film.

4. The device according to claim 1, further comprising:
   a diffusion prevention film overlying the conductors.

5. The device according to claim 1, further comprising:
   a dielectric film provided on the conductors and having a via hole, wherein
      the via plug is provided in the via hole in the dielectric film; and
      a projected edge of the flange portion is aligned with a side surface of the via hole.

6. The device according to claim 5, further comprising:
   a third reinforcing film between a sidewall of the via plug and the side surface of the via hole.

7. The device according to claim 6, wherein the third reinforcing film is disposed on the flange portion.

8. The device according to claim 1, wherein the reinforcing film has a reverse L-Like profile in a cross-sectional view.

9. The device according to claim 5, wherein the reinforcing film has a reverse L-Like profile in a cross-sectional view.

10. The device according to claim 1, wherein at least a part of the via plug is provided directly above the reinforcing film.

11. The device according to claim 5, wherein at least a part of the via plug is provided directly above the reinforcing film.

12. The device according to claim 9, wherein at least a part of the via plug is provided directly above the reinforcing film.

* * * * *